United States Patent
Vasilyev et al.

(10) Patent No.: US 10,719,295 B2
(45) Date of Patent: *Jul. 21, 2020

(54) CIRCUIT TO PERFORM DUAL INPUT VALUE ABSOLUTE VALUE AND SUM OPERATION

(71) Applicant: Google LLC, Mountain View, CA (US)

(72) Inventors: Artem Vasilyev, Danville, CA (US); Albert Meixner, Mountain View, CA (US); Jason Rupert Redgrave, Mountain View, CA (US)

(73) Assignee: Google LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/687,488

(22) Filed: Nov. 18, 2019

(65) Prior Publication Data
US 2020/0159494 A1    May 21, 2020

Related U.S. Application Data

(63) Continuation of application No. 15/594,223, filed on May 12, 2017, now Pat. No. 10,481,870.

(51) Int. Cl.
*G06F 7/50* (2006.01)
*G06T 1/20* (2006.01)
(Continued)

(52) U.S. Cl.
CPC .............. *G06F 7/50* (2013.01); *G06F 9/3001* (2013.01); *G06F 9/30036* (2013.01);
(Continued)

(58) Field of Classification Search
None
See application file for complete search history.

(56) References Cited

U.S. PATENT DOCUMENTS 4,638,450 A * 1/1987 Stoffers ................... G06F 7/494
708/200
4,849,921 A * 7/1989 Yasumoto ............... G06F 7/544
708/201

(Continued)

FOREIGN PATENT DOCUMENTS

CN   1238845    12/1999
CN   1641565    7/2005
(Continued)

OTHER PUBLICATIONS

'www.embedded.com' [online] "Hit performance goals with configurable processors," Steven Leibson, Oct. 17, 2006, [retrieved on Aug. 10, 2017] Retrieved from Internet: URL<http://www.embedded.com/print/4016977> 6 pages.

(Continued)

*Primary Examiner* — Michael D. Yaary
(74) *Attorney, Agent, or Firm* — Fish & Richardson P.C.

(57) ABSTRACT

An execution unit is described. The execution unit includes an arithmetic logic unit (ALU) circuit having a first input to receive a first value and a second input to receive a second value. The ALU circuit includes circuitry to determine an absolute value of the first value and to add the absolute value to the second value. The first input is coupled to a first data path having register space and an output of another ALU of the execution unit circuit as alternative sources of the first value. The second input is coupled to a second data path having the register space as a source for the second value.

20 Claims, 36 Drawing Sheets

Figure 1:
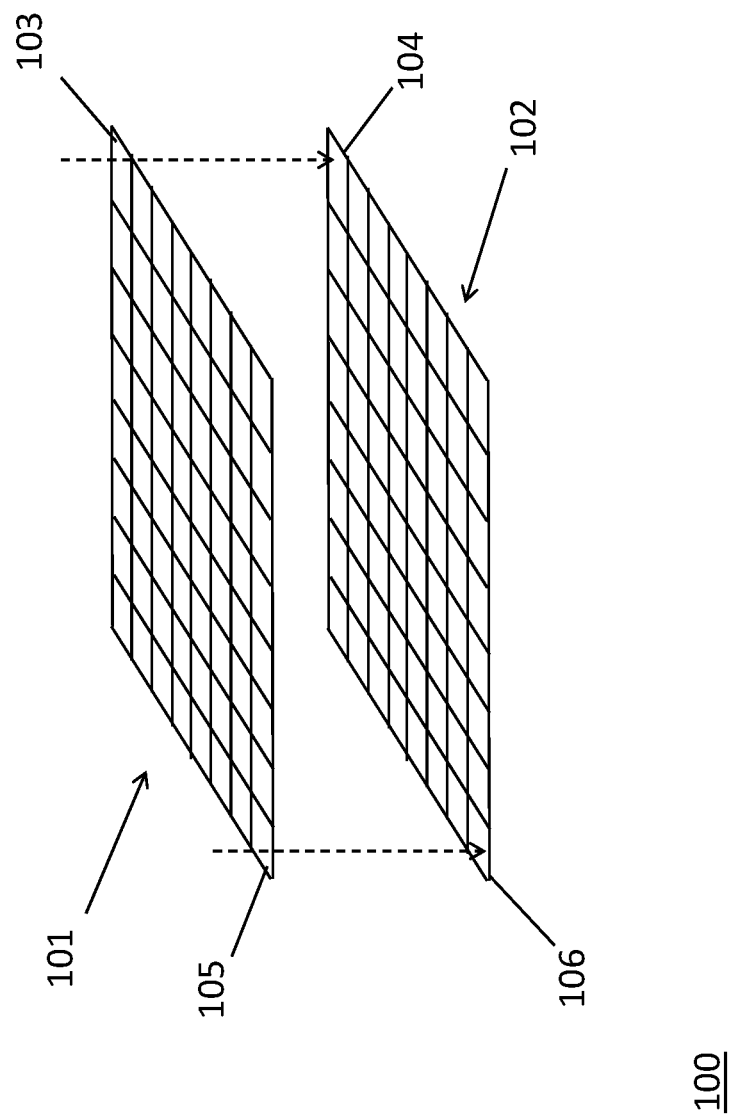

(51) Int. Cl.
*G11C 19/38* (2006.01)
*G06F 9/30* (2018.01)
*G06F 9/38* (2018.01)

(52) U.S. Cl.
CPC ........ *G06F 9/30134* (2013.01); *G06F 9/3893* (2013.01); *G06T 1/20* (2013.01); *G11C 19/38* (2013.01)

(56) References Cited

U.S. PATENT DOCUMENTS

| | | |
|---|---|---|
| 5,446,651 A | 8/1995 | Moyse |
| 5,596,763 A | 1/1997 | Guttag |
| 5,880,979 A * | 3/1999 | Mennemeier ........... G06F 7/544 708/201 |
| 6,219,688 B1 | 4/2001 | Guttag et al. |
| 6,473,529 B1 | 10/2002 | Lin |
| 7,020,854 B2 | 3/2006 | Killian et al. |
| 7,558,947 B1 | 7/2009 | Trivedi et al. |
| 7,681,013 B1 | 3/2010 | Trivedi et al. |
| 7,685,212 B2 | 3/2010 | Sebot et al. |
| 7,817,719 B2 | 10/2010 | Pedersen et al. |
| 8,131,788 B1 | 3/2012 | Chirila-Rus |
| 8,208,553 B2 | 6/2012 | Stojancic et al. |
| 8,976,195 B1 | 3/2015 | Lindholm et al. |
| 2001/0014166 A1 | 8/2001 | Hong |
| 2003/0005267 A1 | 1/2003 | Koba et al. |
| 2004/0002862 A1 | 1/2004 | Kim et al. |
| 2004/0199751 A1 | 10/2004 | Johnson et al. |
| 2004/0267856 A1 | 12/2004 | Macy |
| 2007/0263730 A1 | 11/2007 | Zeng et al. |
| 2014/0149720 A1 | 5/2014 | Muff et al. |
| 2015/0082004 A1 | 3/2015 | Rahman et al. |
| 2016/0283237 A1 | 9/2016 | Pardo et al. |

FOREIGN PATENT DOCUMENTS

| | | |
|---|---|---|
| TW | 575839 | 2/2004 |
| TW | I225640 | 12/2004 |
| TW | 201714091 A | 4/2017 |
| TW | I578231 B | 4/2017 |

OTHER PUBLICATIONS

International Search Report and Written Opinion issued in International Application No. PCT/US2018/012866, dated Jul. 12, 2018, 19 pages.
Invitation to Pay Additional Fees and, Where Applicable, Protest Fee, issued in International Application No. PCT/US2018012866, dated May 7, 2018, 14 pages.
PCT International Preliminary Report on Patentability issued in International Application No. PCT/US2018/012866, dated Aug. 14, 2019, 21 pages.
TW Office Action issued in Taiwanese Application No. 107103608, dated Nov. 19, 2018, 9 pages (English translation).
Written Opinion of the International Preliminary Examining Authority in International Appln. No. PCT/US2018/012866, dated Apr. 5, 2019, 9 pages.
CN Office Action in Chinese Application No. 201880028582, dated May 18, 2020, 15 pages (with English translation).

* cited by examiner

R0 = Alternative Image

R0 = Alternative Image

R1 = |R0 − D| + R1 — 302c

301

$R_0$ = Alternative Image $R_1 = |R_0 - C| + R_1$ — 302d

Fig. 3d

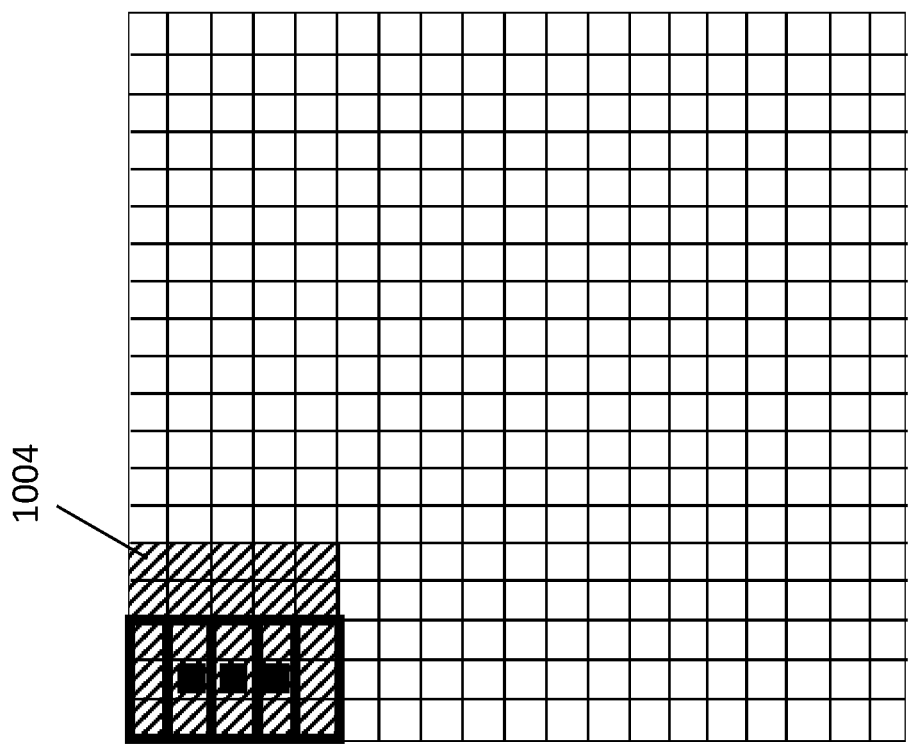

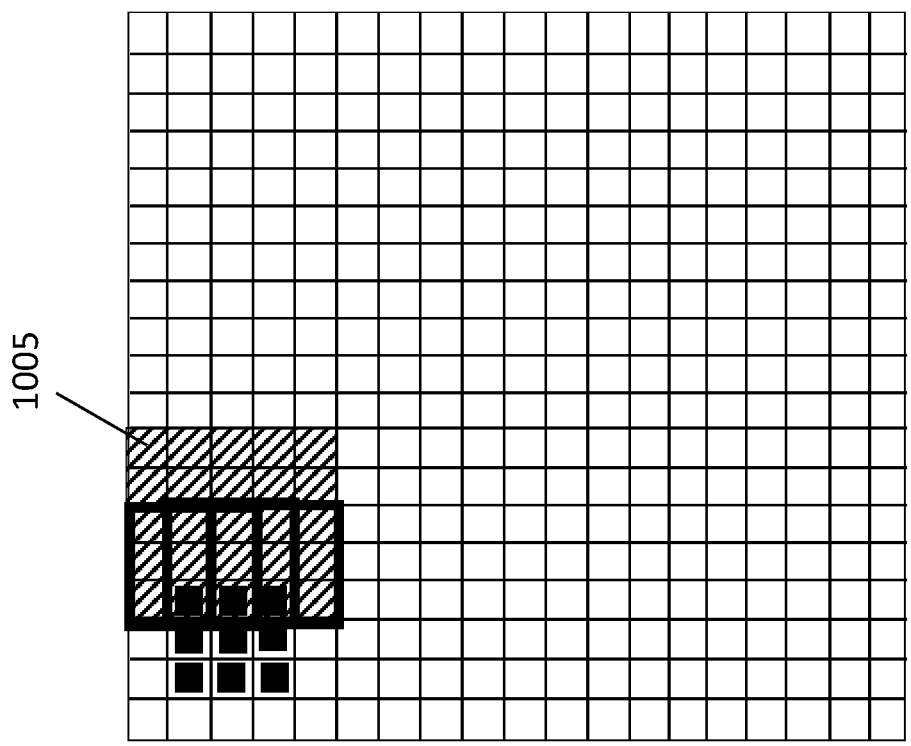

| Scalar instruction 1151 | 2D ALU Instruction 1152 | Memory Access Instruction 1153 | Immediate Operand 1154 |

Fig. 11b

CIRCUIT TO PERFORM DUAL INPUT VALUE ABSOLUTE VALUE AND SUM OPERATION

CROSS-REFERENCE TO RELATED APPLICATION

This is a continuation of U.S. application Ser. No. 15/594,223, filed on May 12, 2017, the disclosure of which is considered part of and is incorporated by reference in the disclosure of this application.

FIELD OF INVENTION

The field of invention pertains generally to the computing sciences and, more specifically, to a circuit to perform a dual input value absolute value and sum operation.

BACKGROUND

Image processing typically involves the processing of pixel values that are organized into an array. Here, a spatially organized two dimensional array captures the two dimensional nature of images (additional dimensions may include time (e.g., a sequence of two dimensional images) and data type (e.g., colors). In a typical scenario, the arrayed pixel values are provided by a camera that has generated a still image or a sequence of frames to capture images of motion. Traditional image processors typically fall on either side of two extremes.

A first extreme performs image processing tasks as software programs executing on a general purpose processor or general purpose-like processor (e.g., a general purpose processor with vector instruction enhancements). Although the first extreme typically provides a highly versatile application software development platform, its use of finer grained data structures combined with the associated overhead (e.g., instruction fetch and decode, handling of on-chip and off-chip data, speculative execution) ultimately results in larger amounts of energy being consumed per unit of data during execution of the program code.

A second, opposite extreme applies fixed function hardwired circuitry to much larger blocks of data. The use of larger (as opposed to finer grained) blocks of data applied directly to custom designed circuits greatly reduces power consumption per unit of data. However, the use of custom designed fixed function circuitry generally results in a limited set of tasks that the processor is able to perform. As such, the widely versatile programming environment (that is associated with the first extreme) is lacking in the second extreme.

A technology platform that provides for both highly versatile application software development opportunities combined with improved power efficiency per unit of data remains a desirable yet missing solution.

SUMMARY

An execution unit is described. The execution unit includes an arithmetic logic unit (ALU) circuit having a first input to receive a first value and a second input to receive a second value. The ALU circuit includes circuitry to determine an absolute value of the first value and to add the absolute value to the second value. The first input is coupled to a first data path having register space and an output of another ALU of the execution unit circuit as alternative sources of the first value. The second input is coupled to a second data path having the register space as a source for the second value.

LIST OF FIGURES

Figure 2:
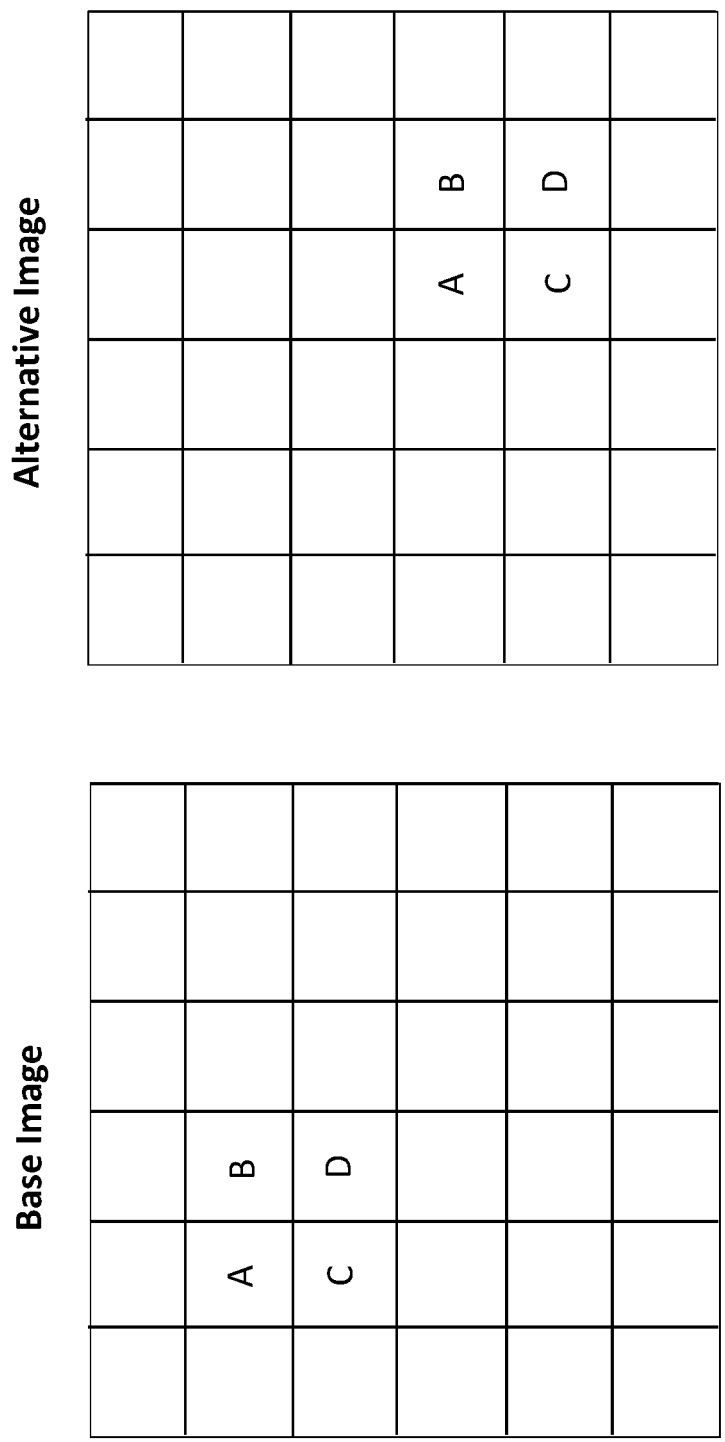
Figure 4:
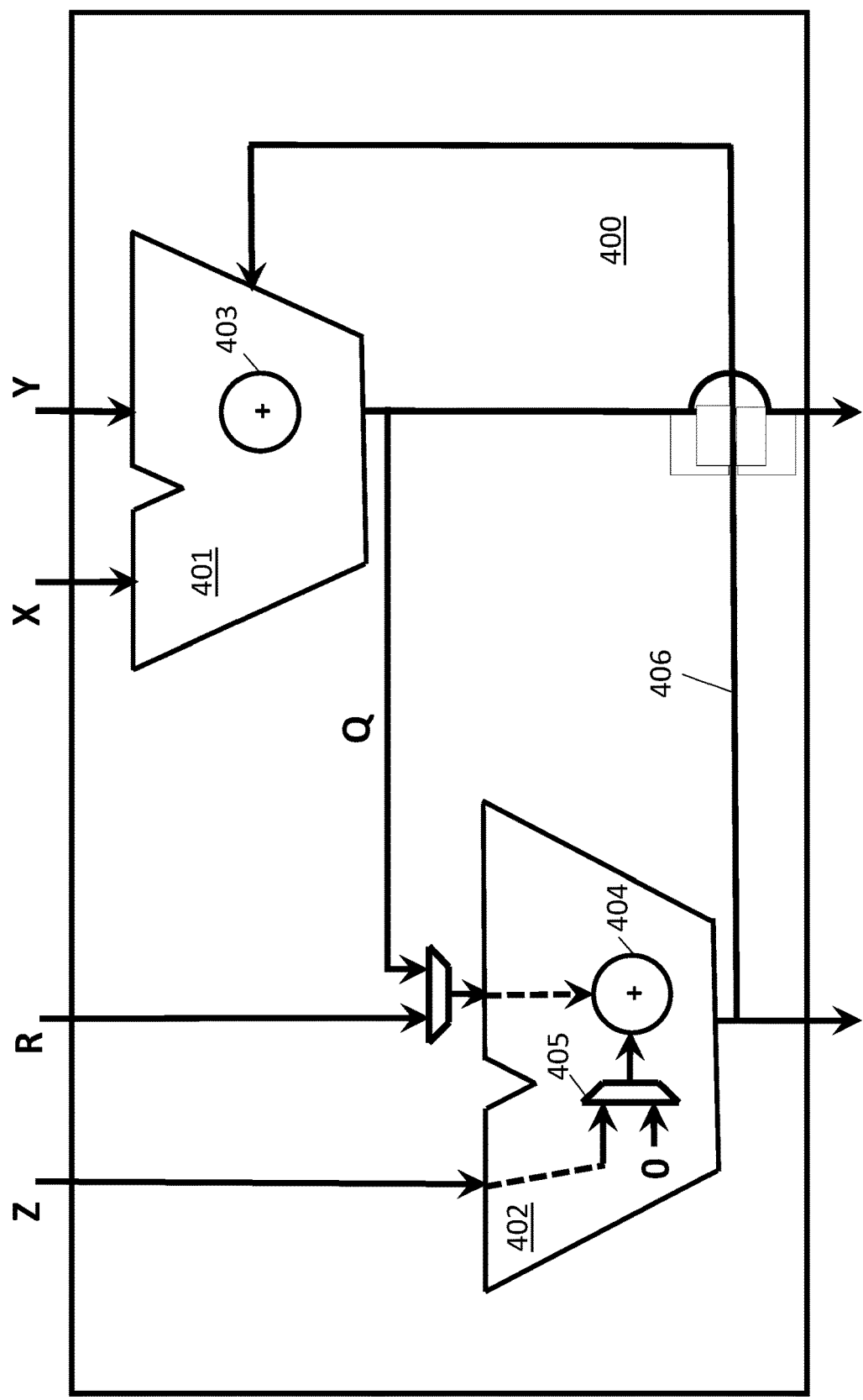
Figure 5:
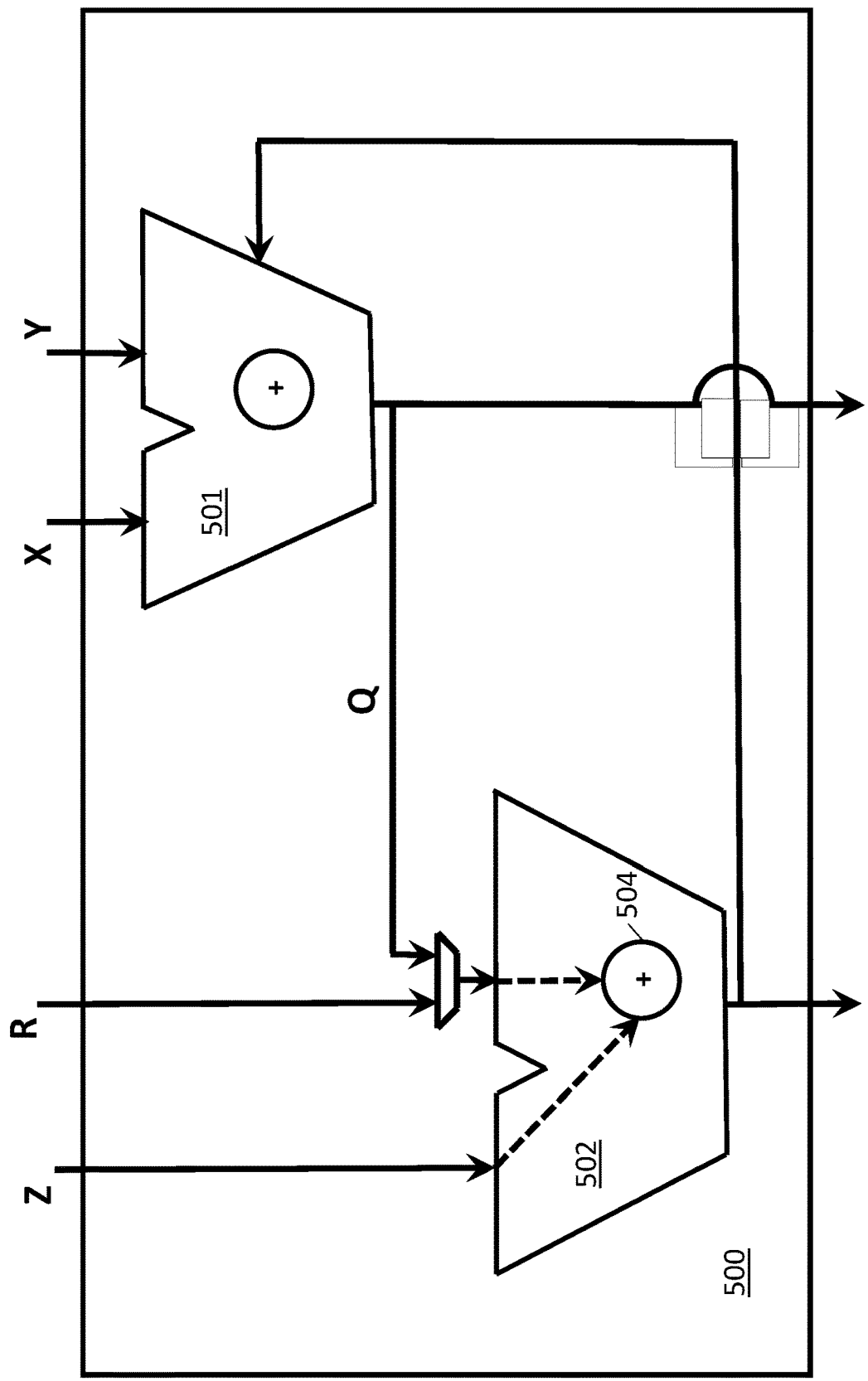
Figure 6:
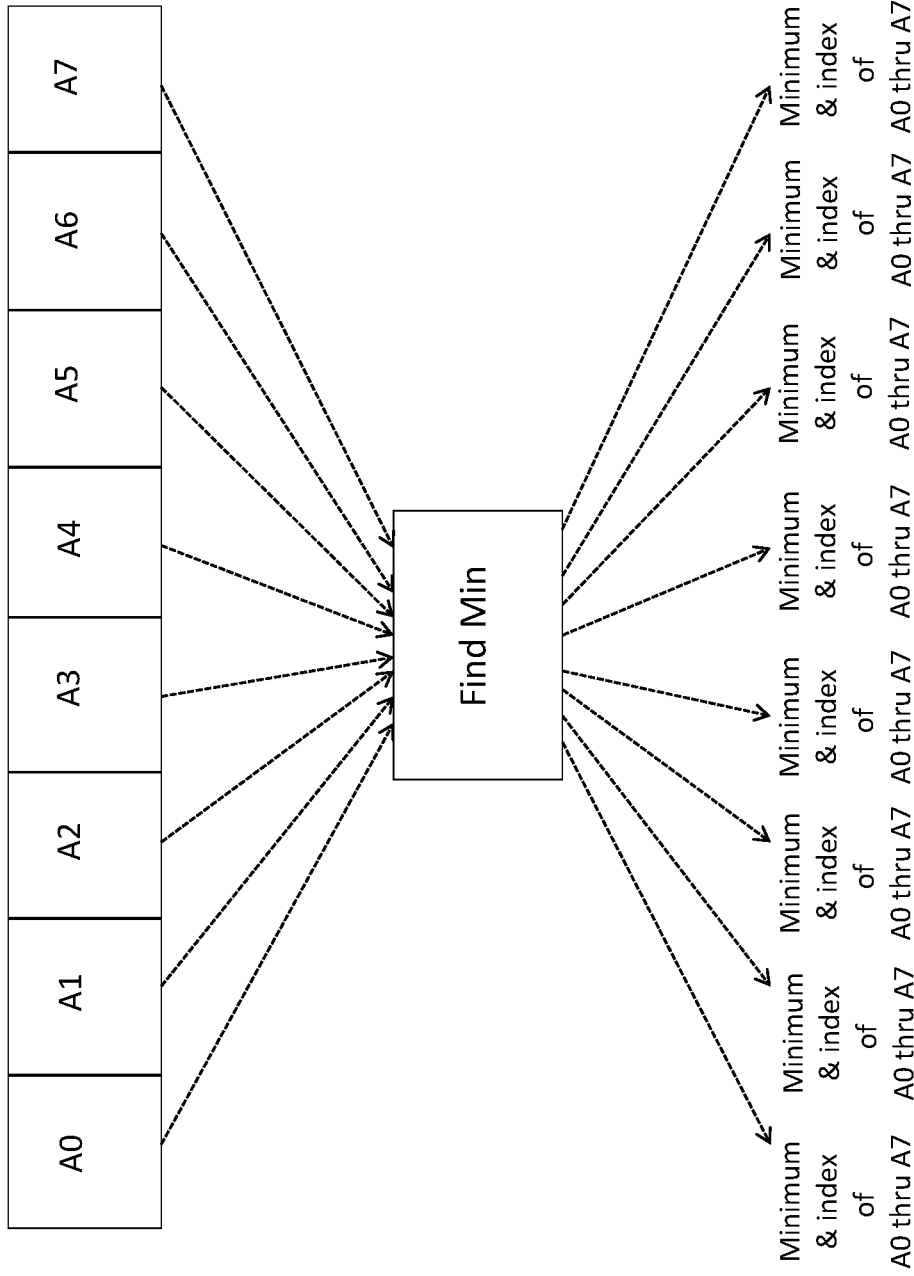
Figure 8:
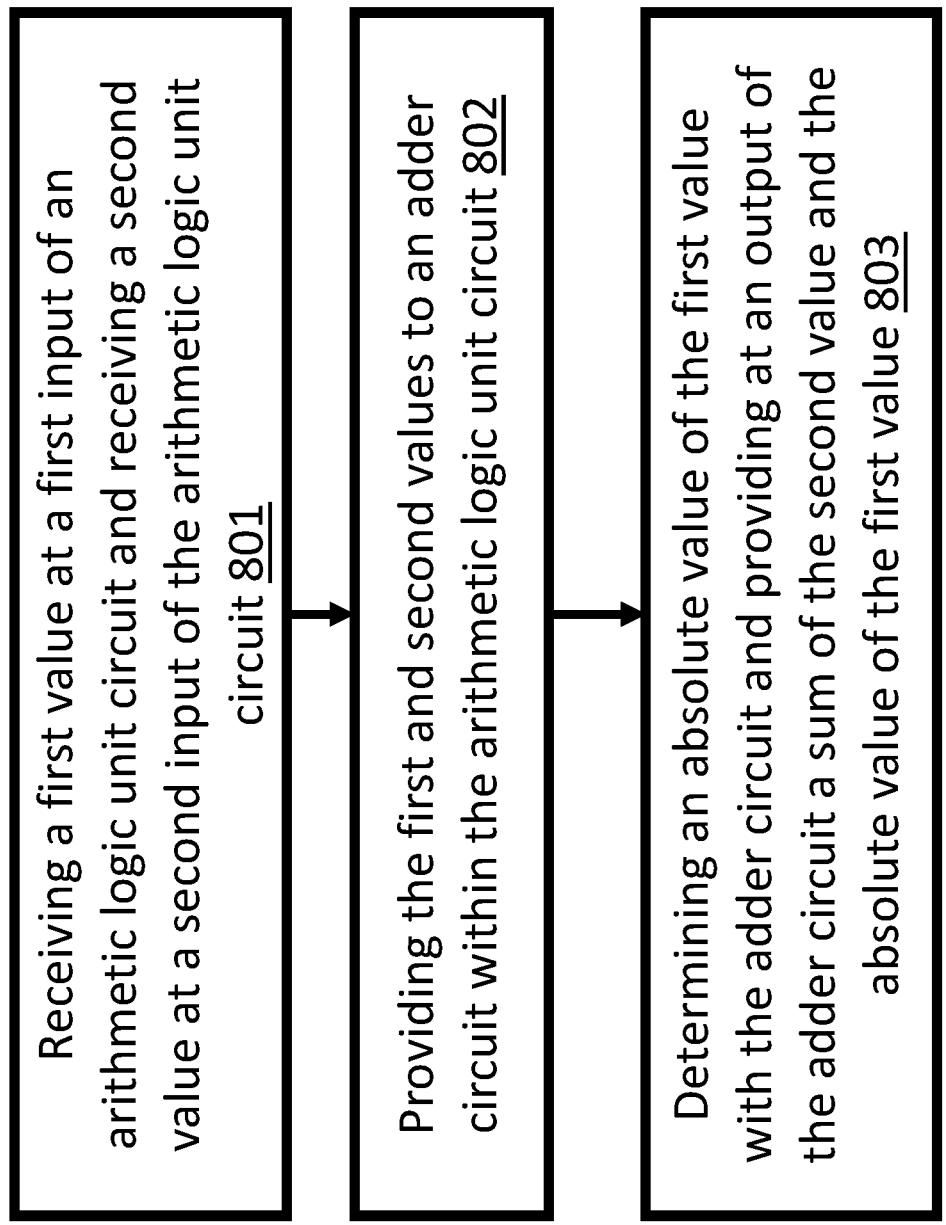
Figure 9:
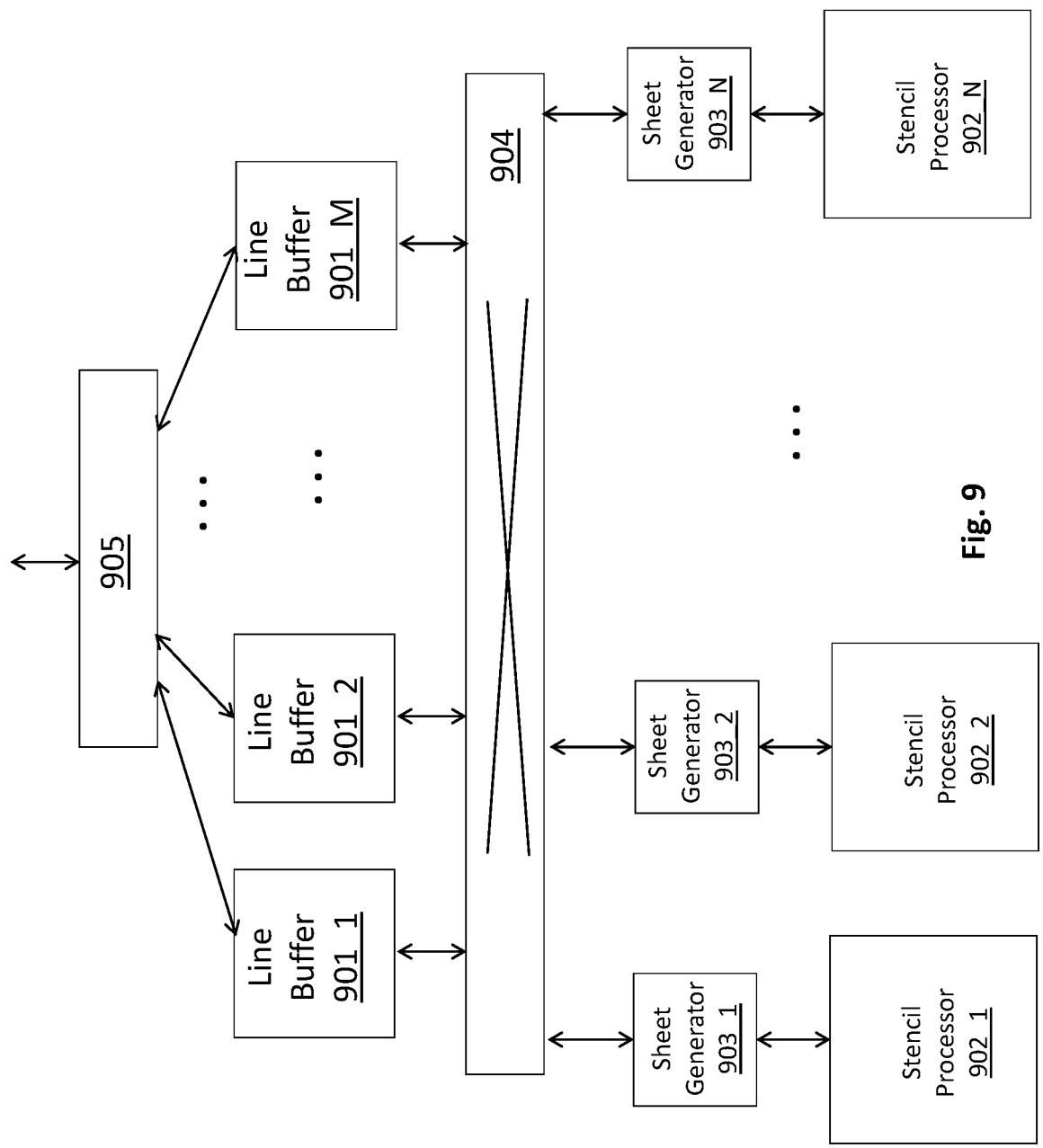
Figure 11A:
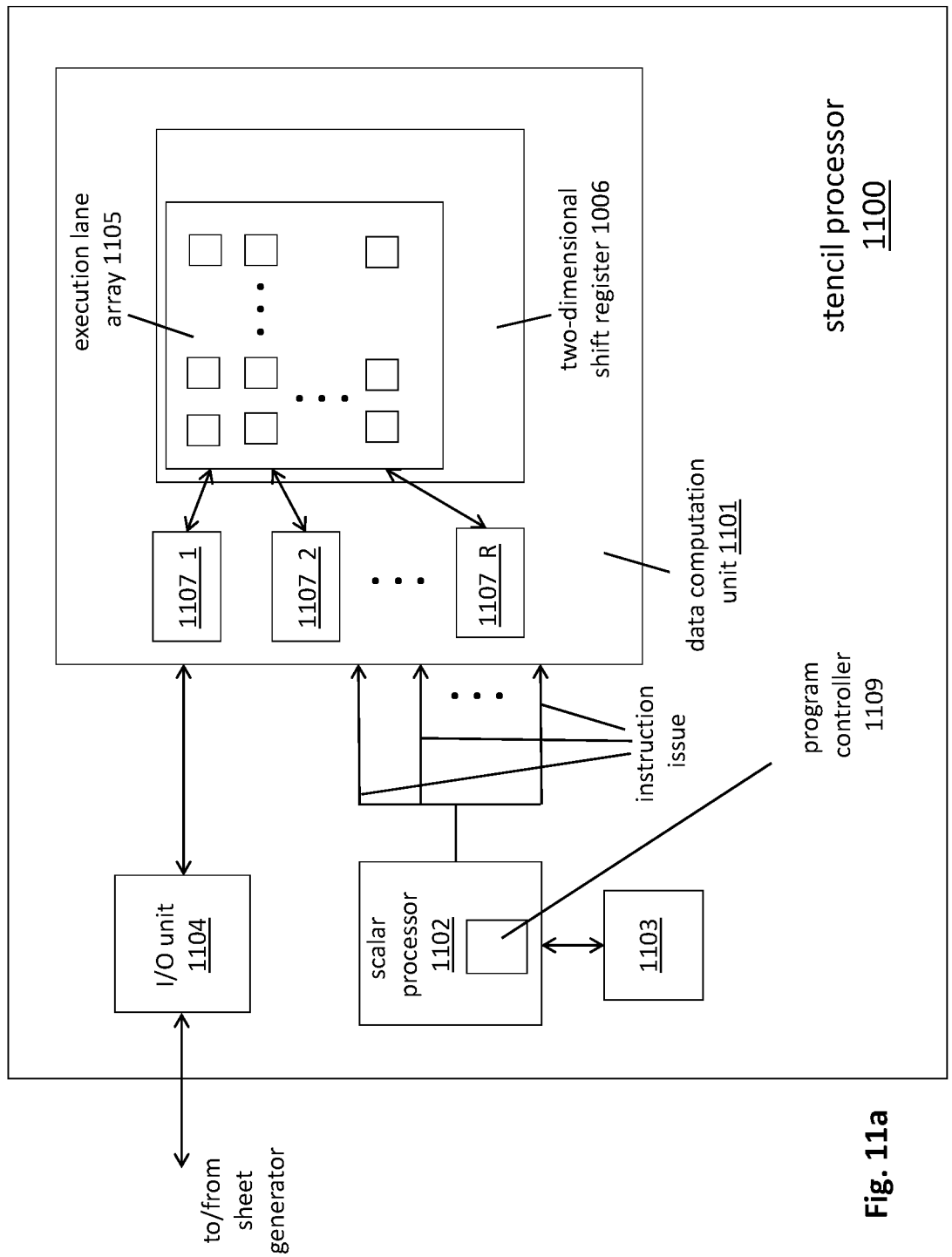
Figure 12:
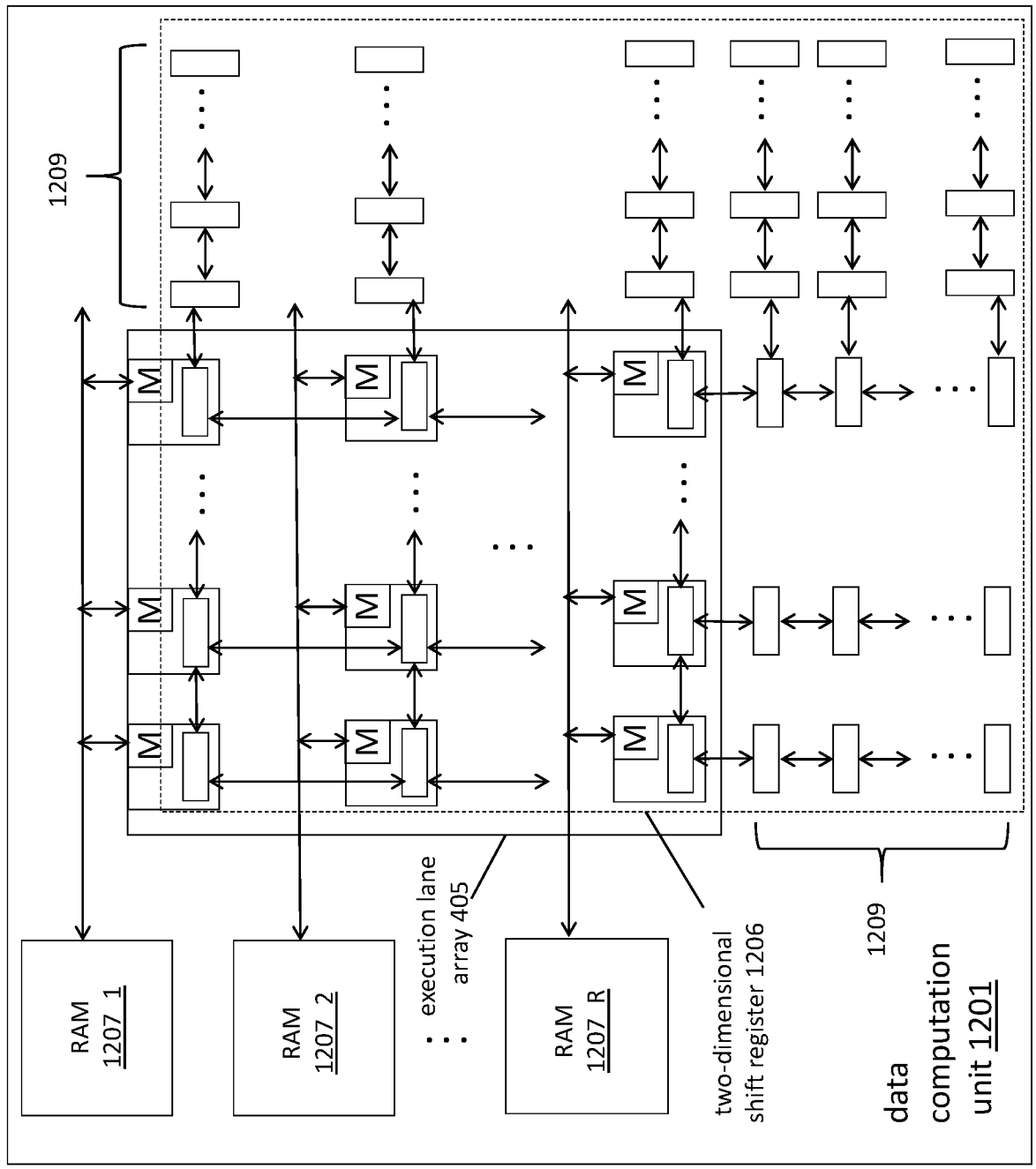
Figure 14:
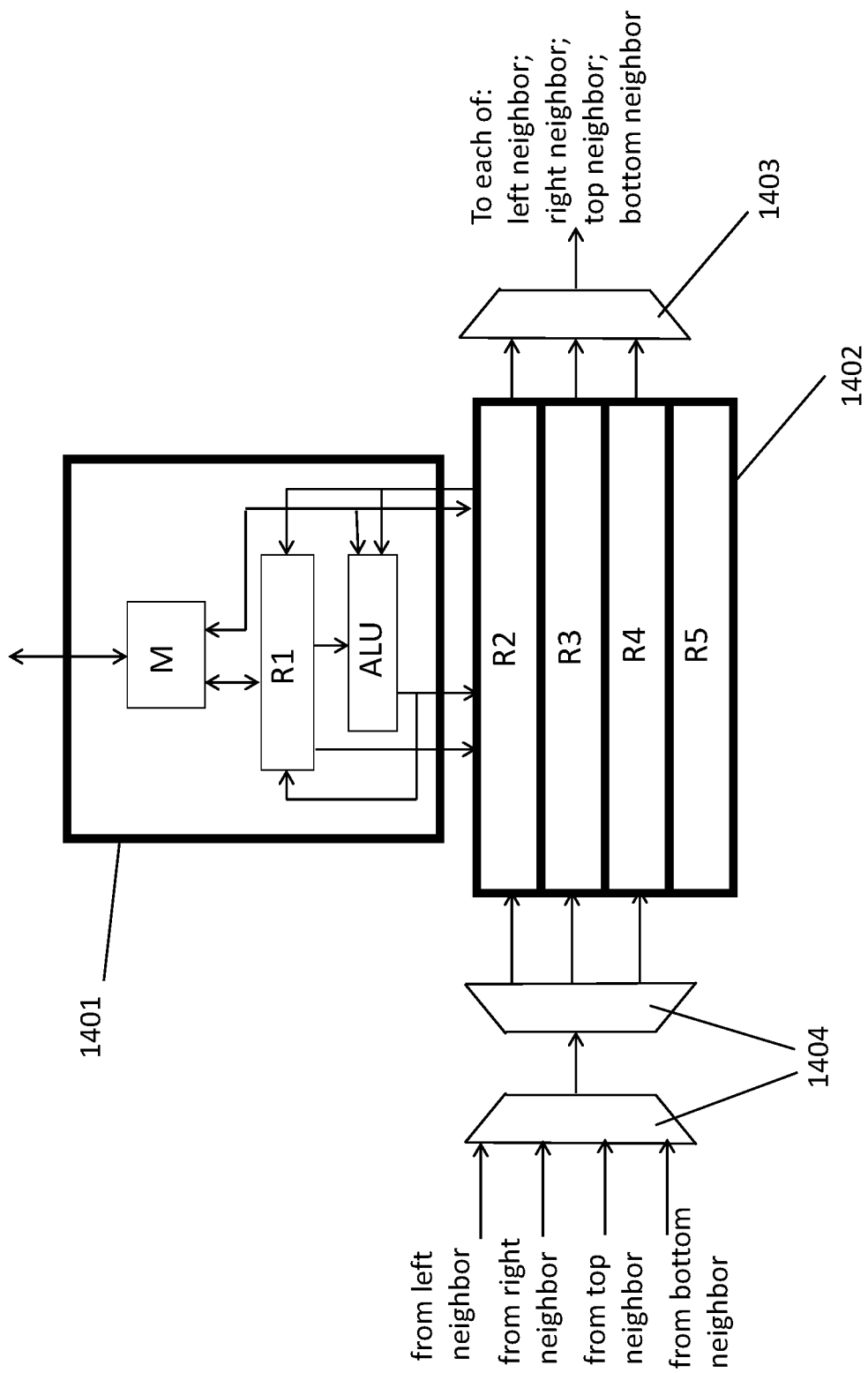
Figure 15:
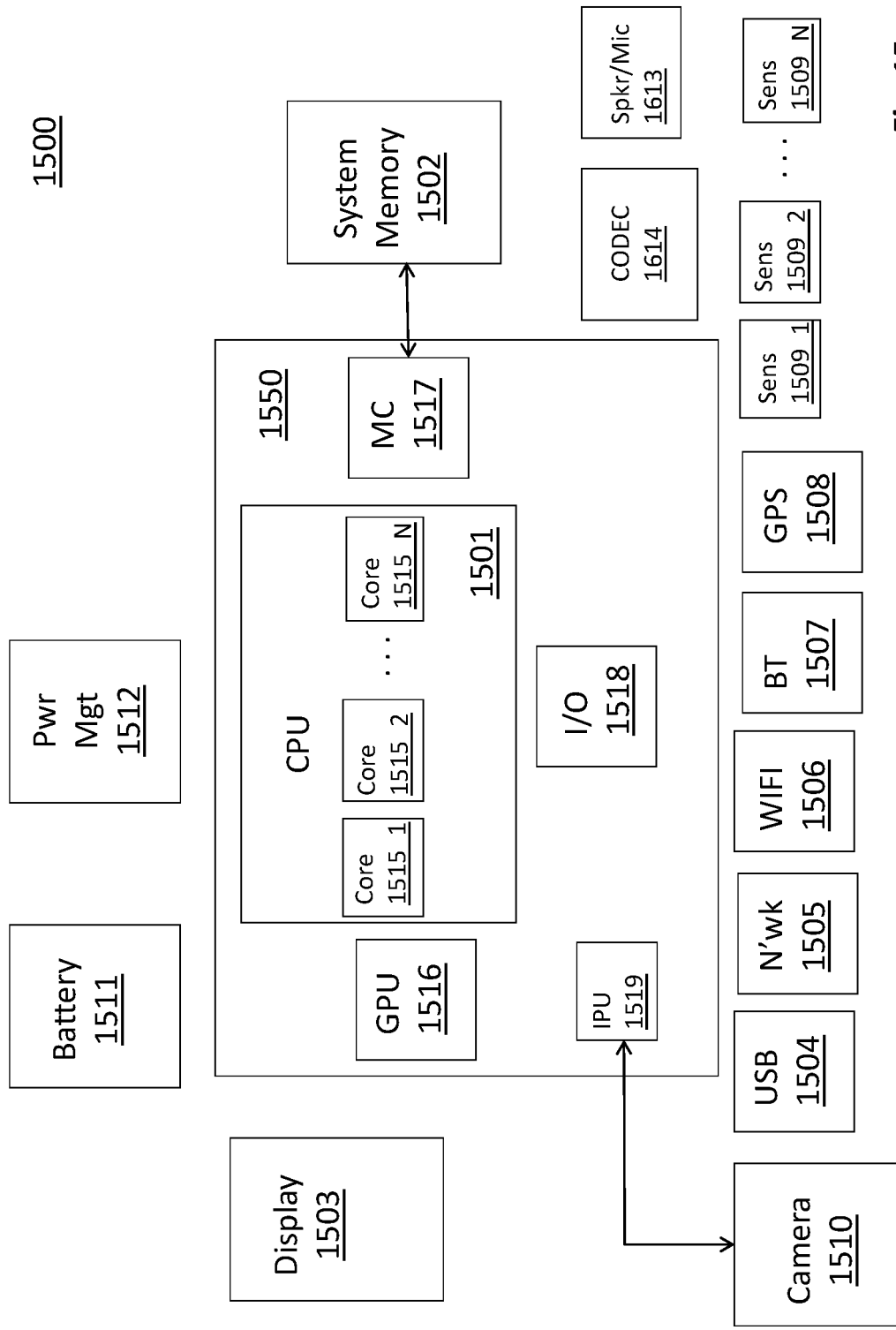

The following description and accompanying drawings are used to illustrate embodiments of the invention. In the drawings:

FIG. 1 shows a high level view of a stencil processor;
FIG. 2 pertains to a block matching process;
FIGS. 3a, 3b, 3c and 3d also pertain to a block matching process;
FIG. 4 shows a prior ALU design;
FIG. 5 shown an improved ALU design;
FIG. 6 shows a FINDMIN operation;
FIGS. 7a, 7b, 7c, 7d also show a FINDMIN operation;
FIG. 8 shows a modified count leading zeros operation;
FIG. 9 shows an embodiment of an image processor hardware architecture;
FIGS. 10a, 10b, 10c, 10d and 10e depict the parsing of image data into a line group, the parsing of a line group into a sheet and the operation performed on a sheet with overlapping stencils;
FIG. 11a shows an embodiment of a stencil processor;
FIG. 11b shows an embodiment of an instruction word of the stencil processor;
FIG. 12 shows an embodiment of a data computation unit within a stencil processor;
FIGS. 13a, 13b, 13c, 13d, 13e, 13f, 13g, 13h, 13i, 13j and 13k depict an example of the use of a two-dimensional shift array and an execution lane array to determine a pair of neighboring output pixel values with overlapping stencils;
FIG. 14 shows an embodiment of a unit cell for an integrated execution lane array and two-dimensional shift array;
FIG. 15 shows an exemplary computing system.

DETAILED DESCRIPTION

A. Two-Dimensional Image Processor

As is known in the art, the fundamental circuit structure for executing program code includes an execution stage and register space. The execution stage contains the execution units for executing instructions (e.g., one or more arithmetic logic units (ALUs), floating point units, memory access units, etc.). Input operands for an instruction to be executed are provided to the execution stage from the register space (or memory if not in register space). The resultant that is generated from the execution stage's execution of an instruction is written back to the register space.

Execution of a software thread on a traditional processor entails sequential execution of a series of instructions through the execution stage. Most commonly, the operations are "scalar" in the sense that a single resultant is generated from a single input operand set. However in the case of "vector" processors, the execution of an instruction by the execution stage will generate a plurality of resultants from a plurality of input operand sets.

FIG. 1 shows a high level view of a unique image processor architecture 100 that includes an array of execution lanes 101 coupled to a two-dimensional shift register array 102. Here, each execution lane in the execution lane array can be viewed as a discrete execution stage that contains the execution units needed to execute the instruction set supported by the processor 100. In various embodiments each execution lane receives the same instruction in the same machine cycle so that the overall processor operates as a two dimensional single instruction multiple data (SIMD) processor.

In various embodiments, each execution lane has its own dedicated register space in a corresponding location within the two dimensional shift register array 102. For example, corner execution lane 103 has its own dedicated register space in corner shift register location 104, corner execution lane 105 has its own dedicated register space in corner shift register location 106, etc. Here, a number of registers may exist in each array location thereby providing each execution lane array with a plurality of dedicated registers.

For example, if each execution lane array has four registers R0, R1, R2, R3 in its corresponding location in the two dimensional shift register array, the two dimensional shift register array may be said to have a first plane of R0 register space across the entire array, a second plane of R1 register space across the entire array, a third plane of R2 register space across the entire array and a fourth plane of R3 register space across the entire array.

Additionally, in various embodiments, the shift register array 102 is able to shift its contents so that each execution lane is able to directly operate, from its own register space, upon a value that was resident in another execution lane's register space during a prior machine cycle. For example, a +1 horizontal shift causes each execution lane's register space to receive a value from its leftmost neighbor's register space. On account of an ability to shift values in both left and right directions along a horizontal axis, and shift values in both up and down directions along a vertical axis, the processor is able to efficiently process stencils of image data.

Here, as is known the art, a stencil is a slice of image surface area whose constituent pixel values are used as input values to determine an output pixel value for an X,Y location that resides in the center of the image surface area. As an example, a new value for a particular pixel location in an output image may be calculated as an average of the pixel values in an area of an input image that the particular pixel location is centered within. Thus, if the stencil has a dimension of 3 pixels by 3 pixels, the particular pixel location may correspond to the middle pixel of the 3×3 pixel array and the average may be calculated over all nine pixels within the 3×3 pixel array.

According to various operational embodiments of the processor 100 of FIG. 1, each execution lane of the execution lane array 101 is responsible for calculating a pixel value for a particular location in an output image. Thus, continuing with the 3×3 stencil averaging example mentioned just above, after an initial loading of input pixel data and a coordinated shift sequence of eight shift operations within the shift register, each execution lane in the execution lane array will have received into its local register space all nine pixel values needed to calculate the average for its corresponding pixel location. Because the processor architecture of FIG. 1 is particularly adept at processing over image stencils it may also be referred to as a stencil processor. More details concerning possible stencil processor embodiments and image processor embodiments that include one or more such stencil processors are provided further below in section F.

B. Block Matching Routine

FIG. 2 shows a depiction of a block matching routine. Block matching is particularly useful for motion estimation (e.g., for video compression), image stabilization, and image fusion algorithms (e.g., exposure fusion, and temporal noise fusion). Here, a specific feature in a first base (e.g., previous) image is looked for in an alternative (e.g., later) image. In the example of FIG. 2, the block ABCD that is present in the base image needs to be found in the alternative image. For simplicity it is assumed that no other pixels in the alternative image have any of the values of the looked for block (A, B, C, D).

FIGS. 3a through 3d show a method for performing block matching on an image processor having a two dimensional execution lane array and a two dimensional shift register array as described just above with respect to FIG. 1. Here, the pixels of the alternative image are kept in the first plane of register space (R0) in the two dimensional shift register array.

A first pixel value of the feature in the base image that is being looked for (e.g., "A") is broadcast to all execution lanes. An absolute difference 302a is then computed on the content in the R0 register space and the value "A" along each lane (e.g., the absolute difference operation computes |x-y| where x=A and y=the content in R0 along each lane). The resultant of the absolute difference is then stored in R1 register space. In an embodiment, for each lane, R1 is initially set equal to 0 and the absolute difference is added to the contents of R1. The resultant of the addition is then stored back into R1. In an embodiment, the instruction format of the SIMD processor includes an immediate operand which is used to broadcast to each of the execution lanes the pixel value A of the base image that the absolute difference is calculated with. Here, if a pixel value in the alternative image in R0 matches (or approximately matches) the broadcast pixel value A then the resultant in R1 should be at (or near) zero ("0"). All other resultants in R1 should be substantially non zero ("/0").

Figure 3A:
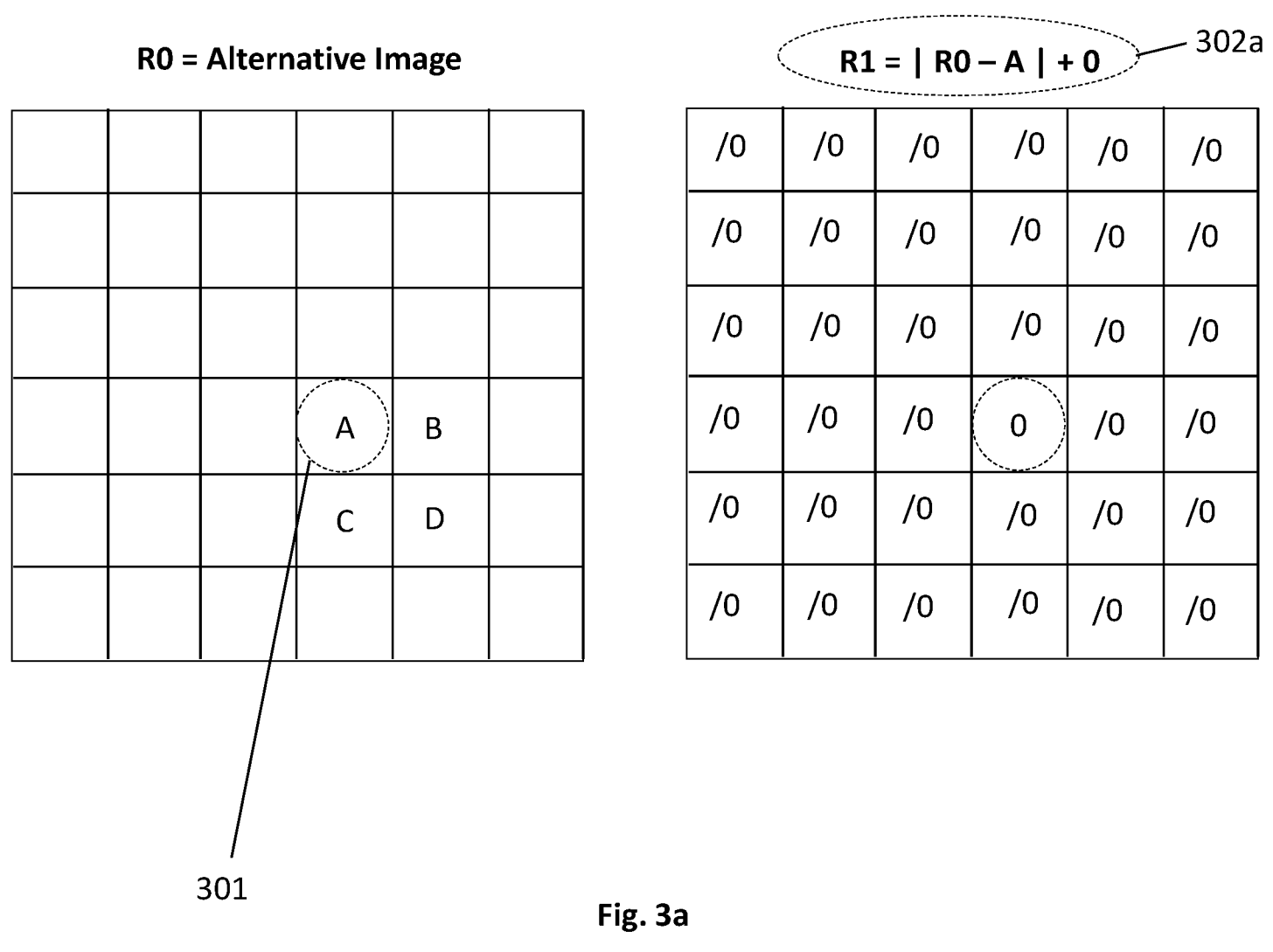
Figure 3B:
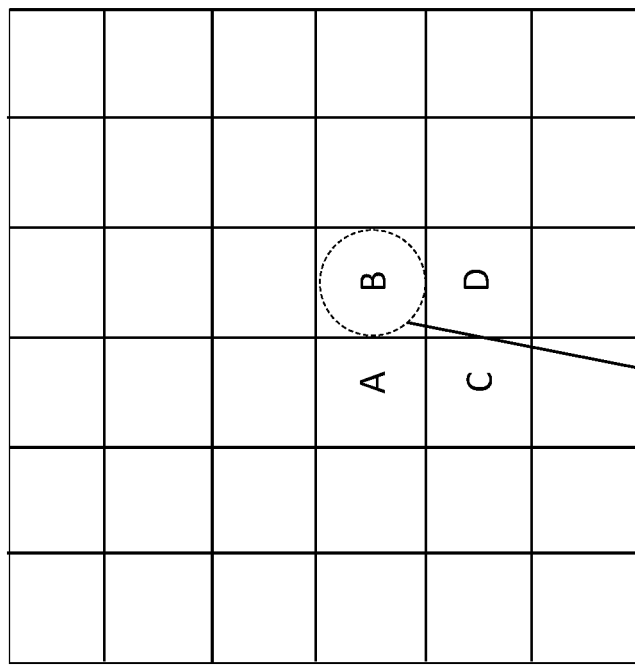

Referring to FIG. 3b, the alternative image is then shifted one unit in the R0 plane of the two-dimensional shift register, a next pixel value "B" in the feature being looked for is broadcast to all execution lanes and the absolute difference is again determined and added to the contents that are stored in R1. As such, each lane performs a "sum of absolute difference" (SAD) operation. That is, for each iteration, firstly, an absolute difference is computed between the newly broadcast base image value (B for the iteration of FIG. 3b) and the newly shifted-in alternative image content in R0. Then, secondly, the result of the absolute difference is accumulated (added) in R1 with the resultant of prior SAD operation(s) (for the iteration of FIG. 3b, the absolute difference computed in FIG. 3b is added in R1 to the absolute difference computed in the first iteration of FIG. 3a). Here, the particular execution lane array location 301 that has had two consecutive pixel matches should have the lowest resultant value in its R1 register space after completion of the SAD operation for the iteration of FIG. 3b. More specifically, location 301 of FIG. 3b, being the location where the particular order of pixel values that are being broadcast aligns with the particular scanning/shifting motion of the alternative image in R0 of the two dimensional shift register array, has a value that is approximately zero in its R1 register space after the iteration of FIG. 3b.

Figure 3C:
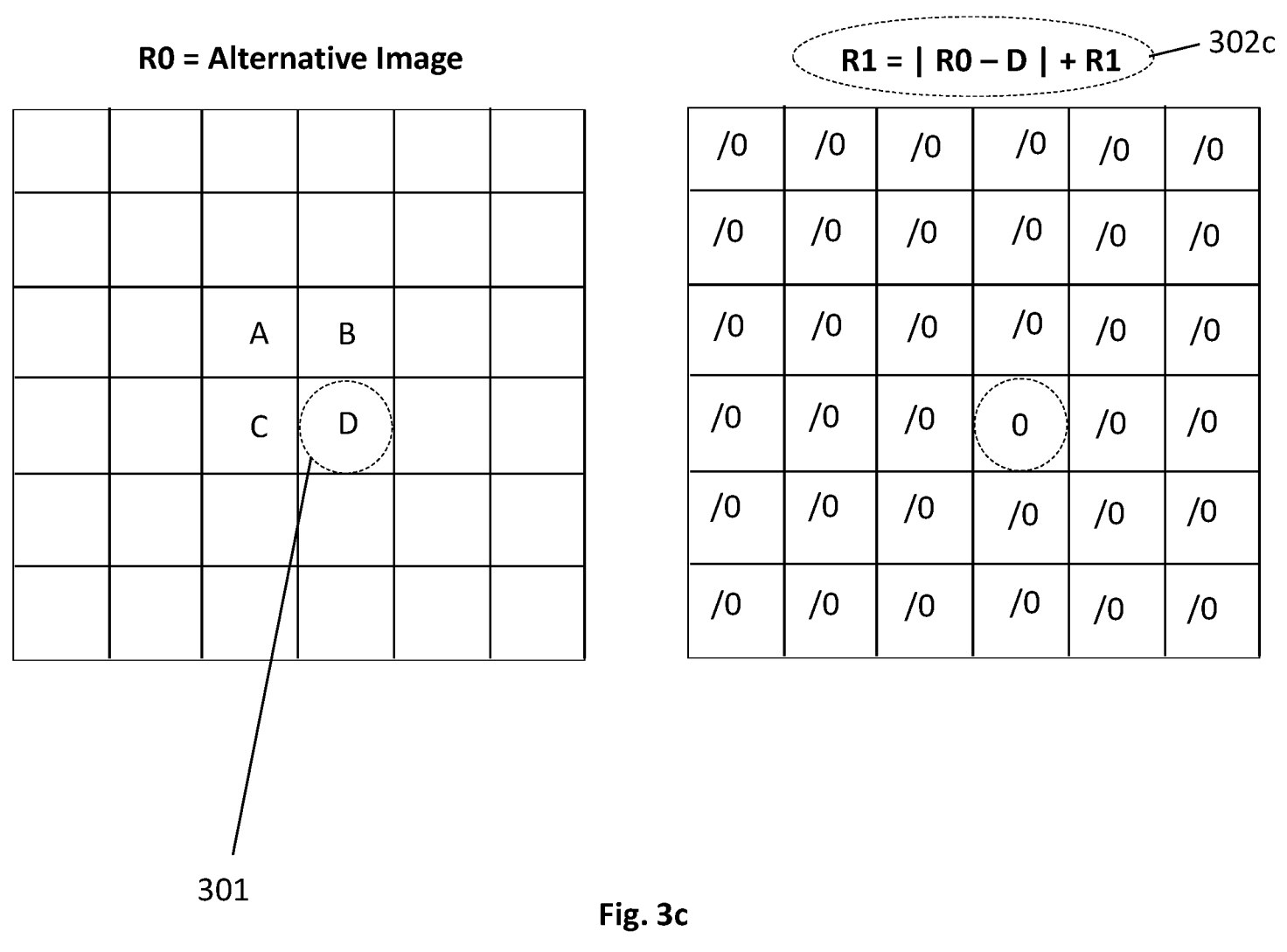
Figure 3D:
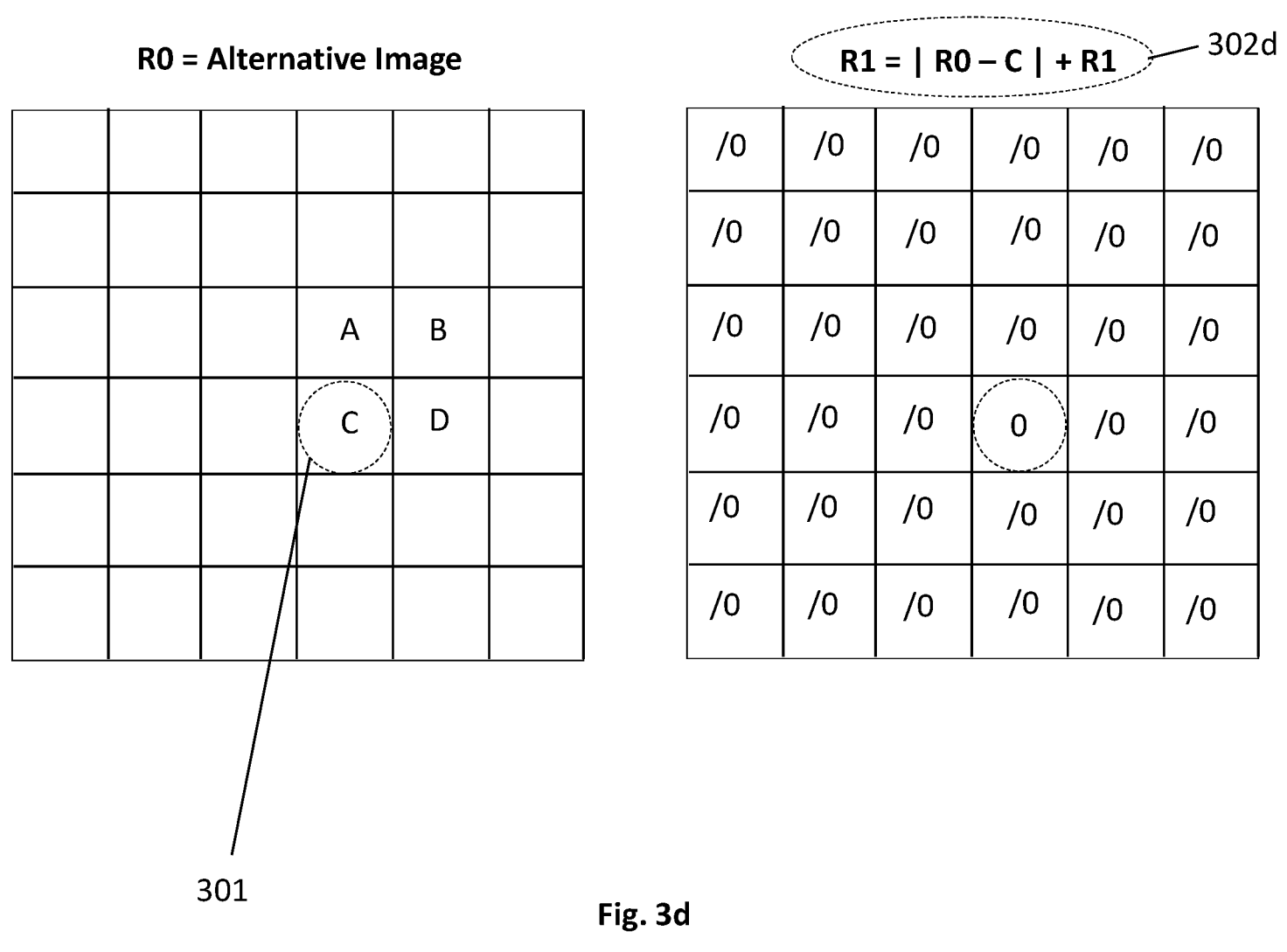

As observed in FIGS. 3c and 3d, the process continues with each next iteration broadcasting a next pixel value of the base image, shifting the R0 alternative image data in a particular scan order, and performing a SAD operation along each lane that computes an absolute difference between the broadcast value and the R0 shifted-in value and then adds the absolute difference to the accumulation of prior SAD resultants in R1 302c, 302d. After a number of iterations sufficient to broadcast all sought for image pixels of the base image and to correspondingly shift the alternative image in R0 over an area that corresponds to the size of the looked for image, ideally, only one location 301 in the execution lane array will have experienced a match on every iteration cycle. As such, this particular array location 301 should be able to maintain a zero or near zero value in its R1 register space (or at least a smaller value than the other execution lanes) after all iterations have been completed.

A "findmin" operation is then executed on the R1 register space across all rows in the array. According to one embodiment of a findmin operation, the lowest corresponding value in each row is kept at each location of its row. A findmin operation is then executed on the R1 register space across all columns in the array. The resultant should identify the pixel that matched the base image on every iteration which, in turn, can be used to identify the precise location of the looked for image in the alternative array. A discussion of an embodiment of the findmin operation is provided further below in section D of the present specification.

C. SAD Instruction with Two ALU Operations

From the example above, the sum of absolute differences calculation 302a through 302d that occurs along each execution lane after each shift of the alternative image and broadcast of a next base image value can be expressed as:

$$R1 <= |R0 - B_B| + R1$$

where R0 is the recently shifted alternative image value, $B_B$ is the next broadcast value of the base image and R1 contains the accumulation of all prior sum of absolute difference calculations made along the same execution lane. The resultant is also written back into R1. As such, more generically, each execution lane repeatedly executes the operation:

$$|x-y|+z$$

where the resultant is stored in the same register space that the z input operand was provided from (R1). In order to maximize the performance of this calculation it is desirable for each execution lane to perform the above calculation with a reduced amount of circuitry and/or fewer circuitry operations. Performing the SAD operation with less circuitry and/or fewer circuitry operations can, e.g., result in higher performance and/or reduced power consumption of SAD computations.

FIG. 4 shows an initial design for an execution lane ALU execution unit circuit 400 (hereinafter, "execution unit") that was only capable of performing the above SAD instruction in three ALU operations. As observed in FIG. 4, the execution unit 400 includes a first arithmetic logic unit (ALU) circuit 401 and a second ALU circuit 402. As is known in the art, an ALU circuit (hereinafter, "ALU") performs arithmetic operations (e.g., addition, subtract, divide) and logic operations (e.g., AND, OR, etc.). The execution unit 400 is responsible for executing various arithmetic and logic program code instructions and may use one or both ALUs 401, 402 depending on which one of these instructions is being executed. As observed in FIG. 4, the first ALU 401 can receive a first input operand X of an instruction from its lane's local register space of the two dimensional shift register array, and, can receive a second input operand Y of an instruction from the same local register space.

The output of the first ALU 401 can be used as an input value Q for the second ALU 402. The second ALU 402 can also receive a third input operand Z of an instruction from the local register space. The second ALU can also receive a fourth input operand R of an instruction from local register space that is multiplexed into the second ALU 402 instead of the Q input value from the first ALU 401. The execution unit 400 can provide a resultant for an instruction directly from whichever of the pair of ALUs 401, 402 performs a final computation for the instruction. For ease of drawing, a number of various other features of the execution unit 400 are not depicted so that the pertinent datapaths of the instant discussion can be emphasized.

Here, the execution unit 400 can execute the three input ADD instruction $$x+y+z$$

in two ALU operations. In this case, a first adder 403 within the first ALU 401 performs a first x+y addition. The x+y result from the first adder 401 is then passed as input value Q to the second ALU 402. The input value Q is passed internally within the second ALU 402 to a second adder 404. A multiplexer 405 within the second ALU 402 is also configured to select input operand Z which presents Z to the second adder 404. The second adder 404 then performs the addition (x+y)+z. The result from the second adder 404 is presented from the execution unit 400 as the resultant of the three input ADD instruction. Thus, two ALU operations (one operation from the first ALU 401 and a second operation from the second ALU 402) are performed in order to execute the three input ADD instruction (as a single instruction).

Unfortunately, as mentioned above, the execution unit 400 of FIG. 4 is only able to perform a SAD operation with three ALU operations in two instructions. Here, the SAD operation can be expressed as:

In order to perform the above operation, the first adder 403 within the first ALU 401 is configured to behave as a subtraction unit that provides x−y as its result (rather than providing x+y as its result). The Q value containing the x−y result from the first adder 403 is then passed to the second ALU 402 and presented to the second adder 404. The second adder 404 determines the absolute of the Q value.

Configuring the second adder 404 to perform an absolute value computation includes: 1) configuring the second adder 404 to perform the computation 0+Q if Q is positive; or, 2) configuring the second adder 404 to perform the computation 0−Q if Q is negative. Here, with respect to operation 2), as is known in the art, an adder can be configured to perform subtraction by, e.g., manipulating a carry input of the adder (e.g., from a 0 to a 1) and/or performing a logical inversion on one of its input values. Note that both computations employ an input value=0. As such, when the second adder 404 is used to perform an absolute value computation (as in the case of the SAD operation presently being described), multiplexer 405 is configured to select the 0 channel (rather than the Z channel as with the three input ADD instruction as described above). This traditional use of an adder to perform an absolute value operation can be characterized as single input value operation of the ALU 402. That is, in performing this operation, the second ALU 402 receives only one input value Q. Importantly, the operation of the second ALU 402 only completes computation of |Q|=|x−y| (an absolute difference). Here, the |Q| resultant from the second ALU 402 is written to external register space from the execution unit 400.

To complete the SAD operation, another ALU operation has to be performed to sum |x−y| and z (=|Q|+z). As such, a second following ADD instruction is executed that reads the |Q| term and the z value as input operands from register space and provides them, e.g., to the first ALU 401 to perform the final |x−y|+z addition. As such, three ALU operations are required to execute a SAD operation: a first to take the difference x−y; a second to take the absolute value of the difference |x−y|; and a third to perform the addition of |x−y| and z. The first two operations consume a first instruction and the third operation consumes a second instruction. With three ALU operations (and two instructions) being performed to compute a single SAD operation, 3N−1 ALU operations may be consumed performing a block matching routine for a block of N pixels.

FIG. 5 shows an improved ALU execution unit 500 that is able to perform the SAD operation with two ALU operations in a single instruction rather than three ALU operations over two instructions. Here, recall from the discussion of the execution unit 400 of FIG. 4 that the second adder 404 is traditionally configured to only determine an absolute value by providing the second adder 404 with an internally generated 0 from multiplexer 405. The improved design of FIG. 5, by contrast, replaces the value of 0 with the input operand z that is the final addend of the SAD instruction. More specifically, the second adder 504 in the second ALU 502 is configured to perform: 1) the operation z+Q if Q is positive; or, 2) the operation z−Q if Q is negative. The resultant of the second adder 504 is therefore |Q|+z=|x−y|+z which corresponds to the resultant of the SAD instruction. Note that in this case the second ALU 502 receives two input values (Q and Z) when performing an operation that includes an absolute value unlike the prior design of FIG. 4 in which the second ALU 402 received only one input value (Q) when performing the absolute value operation.

As such, the SAD operation is executed in two ALU operations and a single instruction rather than three ALU operations and two instructions. This corresponds to approximately a 33% improvement in ALU computation efficiency as compared to the execution unit 400 of FIG. 4 (e.g., 2N ALU computations may be consumed for a block image of N pixels (instead of 3N−1 computations as with the execution unit 400 of FIG. 4)). In an embodiment where the execution lanes include an ALU execution unit having two ALUs akin to the design of FIG. 5, a block matching algorithm for a block image of N pixels can potentially be performed in a total of N ALU computations.

In various embodiments, as alluded to above, the aforementioned absolute value function of the second ALU 502 is implemented as a dual input value function rather than a single input value function. That is, an internally generated 0 is not provided to the second adder 504 when the second adder performs an absolute value function. Instead, in order to perform a generic absolute value operation with adder 504, e.g., to execute an absolute value instruction (ABS) rather than a SAD instruction, a value of 0 is provided to the ALU 502 from register space as a Z input operand of the ABS instruction (the value of 0 may also be generated internally within the machine and loaded into register space or directly provided to the execution unit and/or ALU). Additionally, the input value to the ALU 502 whose absolute value is to be determined by the ABS instruction, e.g., R, is multiplexed into the second ALU 502 from register space (e.g., rather than the Q) as a second input operand of the ABS instruction. Here, the presentation of Z=0 to the second ALU 502 causes adder 504 to behave akin to the traditional adder implemented absolute value function. That is, the adder 504 will: 1) perform the operation 0+R if R is positive; or, 2) 0−R if R is negative. Thus, in such embodiments, the absolute value operation performed by the second ALU 502, whether for a SAD instruction or an ABS instruction, is natively implemented as a two input value operation rather than a single input value operation as with the traditional implementation discussed above with respect to FIG. 4.

In still yet other embodiments, multiplexer 404 may be instantiated in the second adder 502 so that, e.g., absolute value operations other than those used to support the SAD instruction (such as the ABS instruction) operate as a traditional single input operand value operation that relies upon an internally generated value of 0. In still yet other embodiments, multiplexer 404 may exist in the second adder to e.g., support both single input value and dual input value absolute operations (the multiplexer selects the 0 input for the former but selects z for the later). In other or combined embodiments, the two input value absolute value function as described above can be used to support a new kind of absolute value instruction, ABS*, in which the execution unit 500 performs the operation |R|+Z as a single instruction where z can be any input operand value (and need not be 0).

In various embodiments, the execution unit 500 of FIG. 5 may still support SAD operations as described above with respect to FIG. 4 (three ALU operations instead of two). Such operation may be useful, e.g., where the accumulated summation may or will consume more bits than the bit width of the machine. Here, the first and second ALU operations (which determine |x−y|) may be calculated with a lower precision that is equal to the bit width of the machine and the third ALU operation tabulates the accumulation in two or more registers to provide for accumulated values that are larger than the machines native bit width.

D. Row/Column Findmin Operation

FIGS. 6 and 7a through 7d pertain to a row/column find minimum operation that can also be executed on an image processor having a two-dimensional execution lane array and a corresponding two-dimensional shift register. Row/column find min operations are particularly useful for statistics computations and block matching post-processing as described above in section B.

Referring to FIG. 6, for simplicity, only a single row of the execution/register array is shown. However, in actual implementation, a column find minimum operation can be implemented on a same processor that implements a row find minimum operation. Additionally, the minimum for a row (or column) can simultaneously be found for any number of rows (or columns) in the register array (including up to all rows/columns). Additionally, the dimension of the row/column is only shown to be 8 locations wide, whereas, in actual implementations the execution lane and shift register arrays may be 16×16 or even larger.

As observed in FIG. 6, the resultant of a row find minimum operation corresponds to the smallest value amongst all values within a same row and its location/position (also referred to as its index) in the row. Likewise, the resultant of a column find minimum operation corresponds to the smallest value amongst all values within a same column and its location/position within the column. As with the row sum and prefix sum operations discussed at length in the preceding sections, the row/column find minimum operation employs the use of a two dimensional shift register than can roll shifts to/from array edge locations 701.

FIGS. 7a through 7d show an embodiment of machine level operations for a row prefix operation. Initially, as observed in FIG. 7a, a row is loaded with data values A0 through A7 in the respective R0 register location of each execution lane. Also, the index of each row location is loaded into the R1 register space of each execution lane.

Figure 7A:
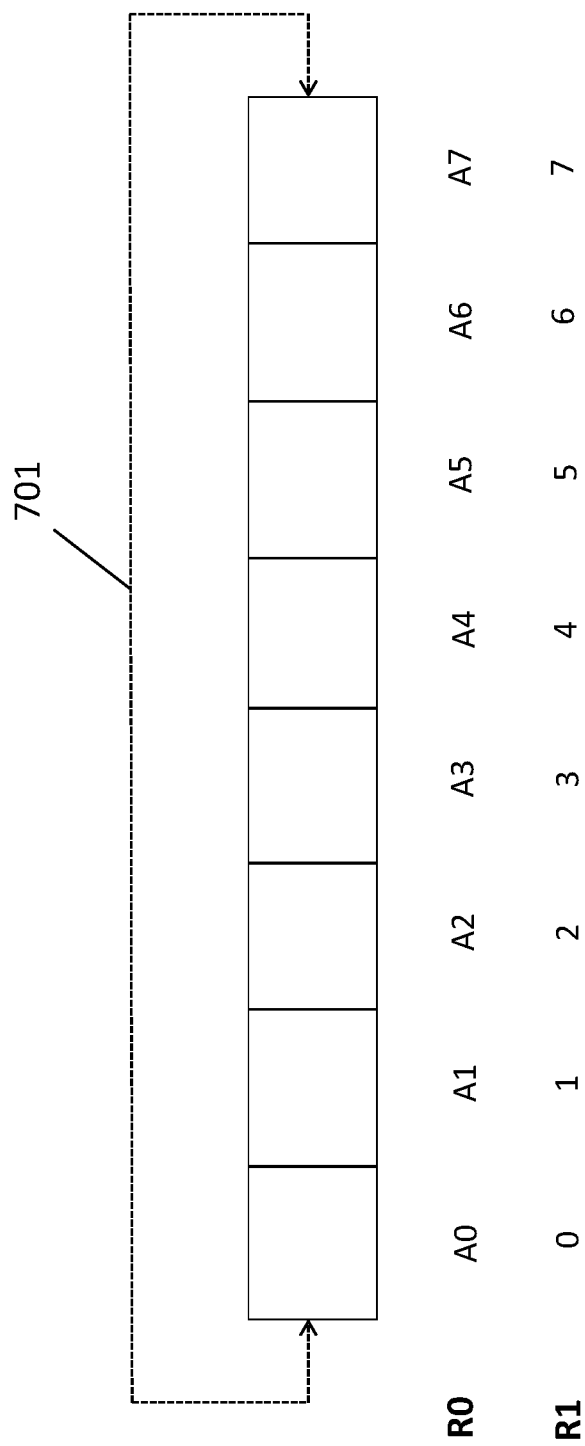
Figure 7B:
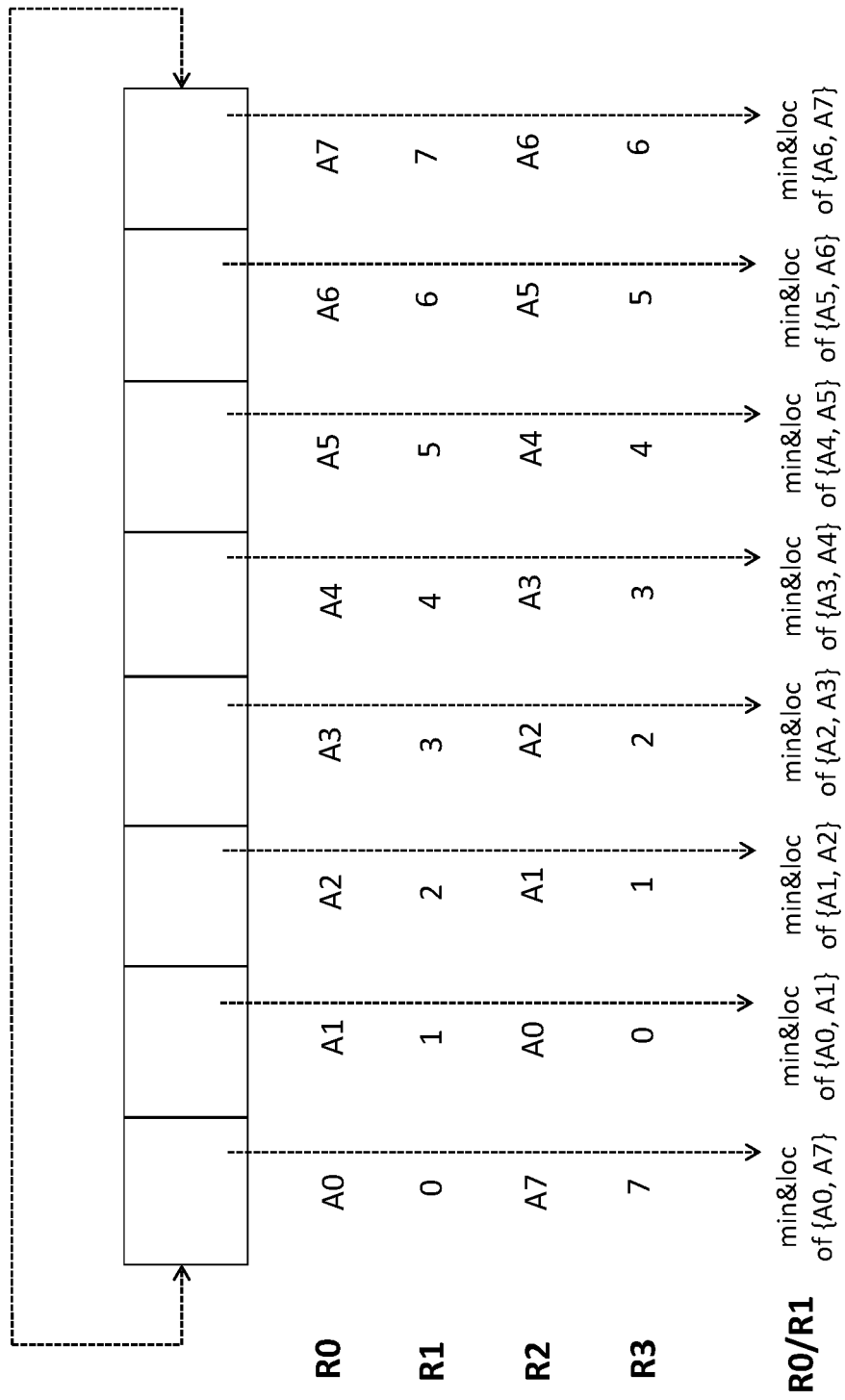

In a first iteration of machine level operations, which are depicted in FIG. 7b, the content of the R0 and R1 register locations are shifted one unit into the R2 and R3 register space of a neighboring execution lane's register space. The respective values of the R0 and R2 registers are then compared within each execution lane. The minimum value of the comparison and its corresponding index are stored into the R0 and R1 register space. That is, if the R0 value is less than the R2 value, the R0 and R1 registers maintain their original content. Whereas, if the R2 value is less than the R0 value, the R2 value is written into R0 and the R3 value is written into R1. This has the effect of keeping the minimum value of the comparison in R0 and its index in R1.

Figure 7C:
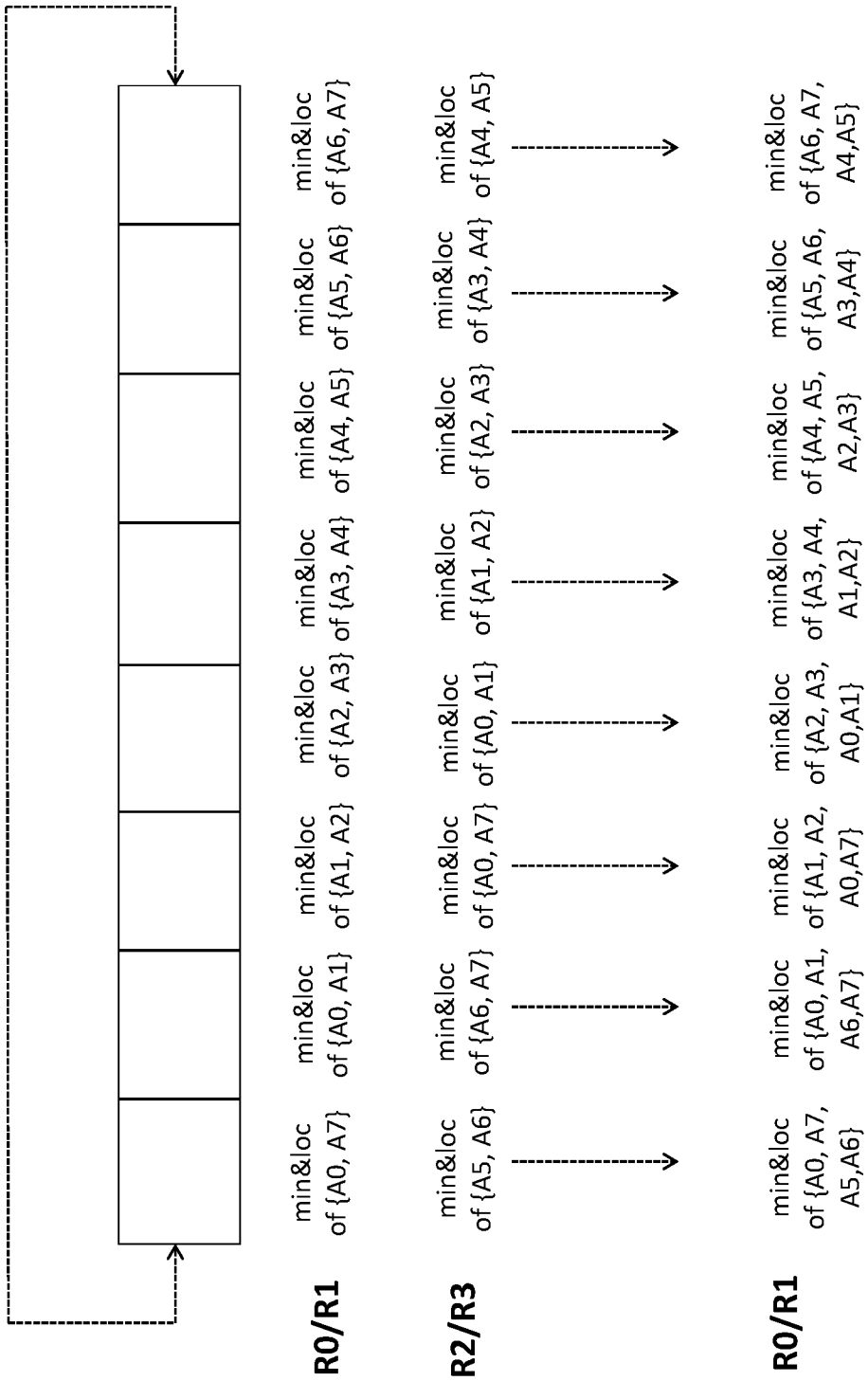

In a second iteration of machine level operations, which are depicted in FIG. 7c, the content of the R0 and R1 register locations are shifted two units into the R2 and R3 register space of a downstream execution lane. Thus, once again, the shift amount doubles with a next iteration. The respective values of the R0 and R2 registers are then compared within each execution lane. The minimum value of the comparison and its corresponding index are stored into the R0 and R1 register space. This has the effect of keeping the minimum value observed from both comparisons that have been performed in each execution lane in R0 and its index in R1.

Figure 7D:
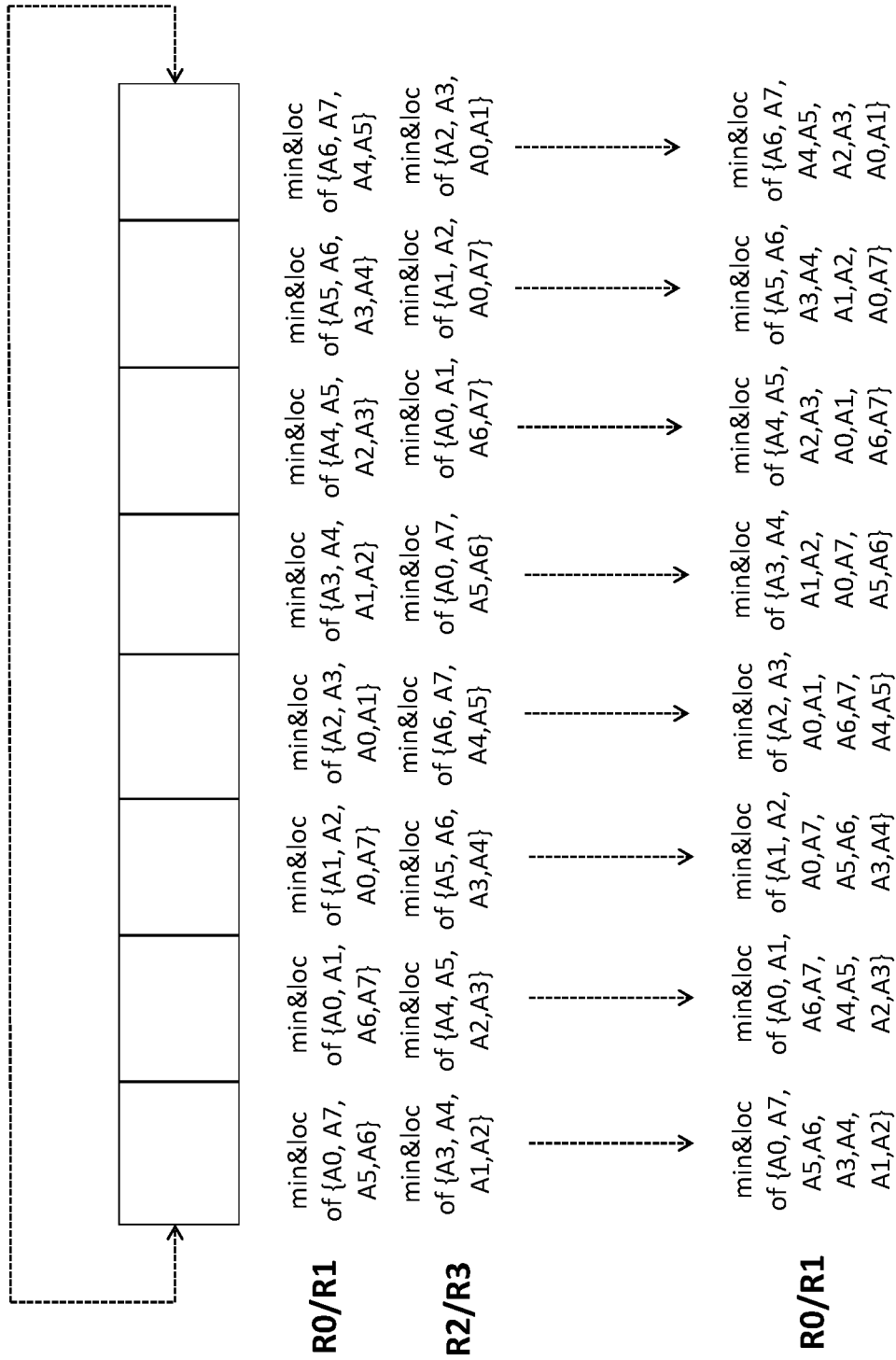

In a third iteration of machine level operations, observed in FIG. 7d, the content of the R0 and R1 register locations are shifted four units into the R2 and R3 register space of a downstream execution lane. The respective values of the R0 and R2 registers are then compared within each execution lane. The minimum value of the comparison and its corresponding index are stored into the R0 and R1 register space. This has the effect of keeping the minimum value observed from all three comparisons that have been performed in each execution lane in R0 and its index in R1.

After the third iteration, the find minimum operation is complete as each execution lane will have the minimum value of the entire row in its R0 register space and its corresponding index in its R1 register space (the row location that was originally provided with the minimum value will find its own row location identified in its R1 register space). If the row were of dimension sixteen, only one more set of operations based on a shift of the R0 and R1 register contents downstream in the shift register by eight locations would be needed to provide the minimum of all sixteen different locations in all sixteen execution lanes.

FIG. 8 shows a methodology described above. The method includes receiving a first value at a first input of an arithmetic logic unit circuit and receiving a second value at a second input of the arithmetic logic unit circuit 801. The method includes providing the first and second values to an adder circuit within the arithmetic logic unit circuit 802. The method includes determining an absolute value of the first value with the adder circuit and providing at an output of the adder circuit a sum of the second value and the absolute value of the first value 803.

E. Image Processor and Stencil Processor Embodiments

FIG. 9 shows an embodiment of an architecture 900 for an image processor implemented in hardware. The image processor may be targeted, for example, by a compiler that converts program code written for a virtual processor within a simulated environment into program code that is actually executed by the hardware processor. As observed in FIG. 9, the architecture 900 includes a plurality of line buffer units 901_1 through 901_M interconnected to a plurality of stencil processor units 902_1 through 902_N and corresponding sheet generator units 903_1 through 903_N through a network 904 (e.g., a network on chip (NOC) including an on chip switch network, an on chip ring network or other kind of network). In an embodiment, any line buffer unit may connect to any sheet generator and corresponding stencil processor through the network 904.

In an embodiment, program code is compiled and loaded onto a corresponding stencil processor 902 to perform the image processing operations earlier defined by a software developer (program code may also be loaded onto the stencil processor's associated sheet generator 903, e.g., depending on design and implementation). In at least some instances an image processing pipeline may be realized by loading a first kernel program for a first pipeline stage into a first stencil processor 902_1, loading a second kernel program for a second pipeline stage into a second stencil processor 902_2, etc. where the first kernel performs the functions of the first stage of the pipeline, the second kernel performs the functions of the second stage of the pipeline, etc. and additional control flow methods are installed to pass output image data from one stage of the pipeline to the next stage of the pipeline.

In other configurations, the image processor may be realized as a parallel machine having two or more stencil processors 902_1, 902_2 operating the same kernel program code. For example, a highly dense and high data rate stream of image data may be processed by spreading frames across multiple stencil processors each of which perform the same function.

In yet other configurations, essentially any DAG of kernels may be loaded onto the hardware processor by configuring respective stencil processors with their own respective kernel of program code and configuring appropriate control flow hooks into the hardware to direct output images from one kernel to the input of a next kernel in the DAG design.

As a general flow, frames of image data are received by a macro I/O unit 905 and passed to one or more of the line buffer units 901 on a frame by frame basis. A particular line buffer unit parses its frame of image data into a smaller region of image data, referred to as a "a line group", and then passes the line group through the network 904 to a particular sheet generator. A complete or "full" singular line group may be composed, for example, with the data of multiple contiguous complete rows or columns of a frame (for simplicity the present specification will mainly refer to contiguous rows). The sheet generator further parses the line group of image data into a smaller region of image data, referred to as a "sheet", and presents the sheet to its corresponding stencil processor.

In the case of an image processing pipeline or a DAG flow having a single input, generally, input frames are directed to the same line buffer unit 901_1 which parses the image data into line groups and directs the line groups to the sheet generator 903_1 whose corresponding stencil processor 902_1 is executing the code of the first kernel in the pipeline/DAG. Upon completion of operations by the stencil processor 902_1 on the line groups it processes, the sheet generator 903_1 sends output line groups to a "downstream" line buffer unit 901_2 (in some use cases the output line group may be sent back to the same line buffer unit 901_1 that earlier had sent the input line groups).

One or more "consumer" kernels that represent the next stage/operation in the pipeline/DAG executing on their own respective other sheet generator and stencil processor (e.g., sheet generator 903_2 and stencil processor 902_2) then receive from the downstream line buffer unit 901_2 the image data generated by the first stencil processor 902_1. In this manner, a "producer" kernel operating on a first stencil processor has its output data forwarded to a "consumer" kernel operating on a second stencil processor where the consumer kernel performs the next set of tasks after the producer kernel consistent with the design of the overall pipeline or DAG.

A stencil processor 902 is designed to simultaneously operate on multiple overlapping stencils of image data. The multiple overlapping stencils and internal hardware processing capacity of the stencil processor effectively determines the size of a sheet. Here, within a stencil processor 902, arrays of execution lanes operate in unison to simultaneously process the image data surface area covered by the multiple overlapping stencils.

As will be described in more detail below, in various embodiments) sheets of image data are loaded into a two-dimensional register array structure within the stencil processor 902. The use of sheets and the two-dimensional register array structure is believed to effectively provide for power consumption improvements by moving a large amount of data into a large amount of register space as, e.g., a single load operation with processing tasks performed directly on the data immediately thereafter by an execution lane array. Additionally, the use of an execution lane array and corresponding register array provide for different stencil sizes that are easily programmable/configurable.

FIGS. 10a through 10e illustrate at a high level embodiments of both the parsing activity of a line buffer unit 901, the finer grained parsing activity of a sheet generator unit 903 as well as the stencil processing activity of the stencil processor 902 that is coupled to the sheet generator unit 903.

Figure 10A:
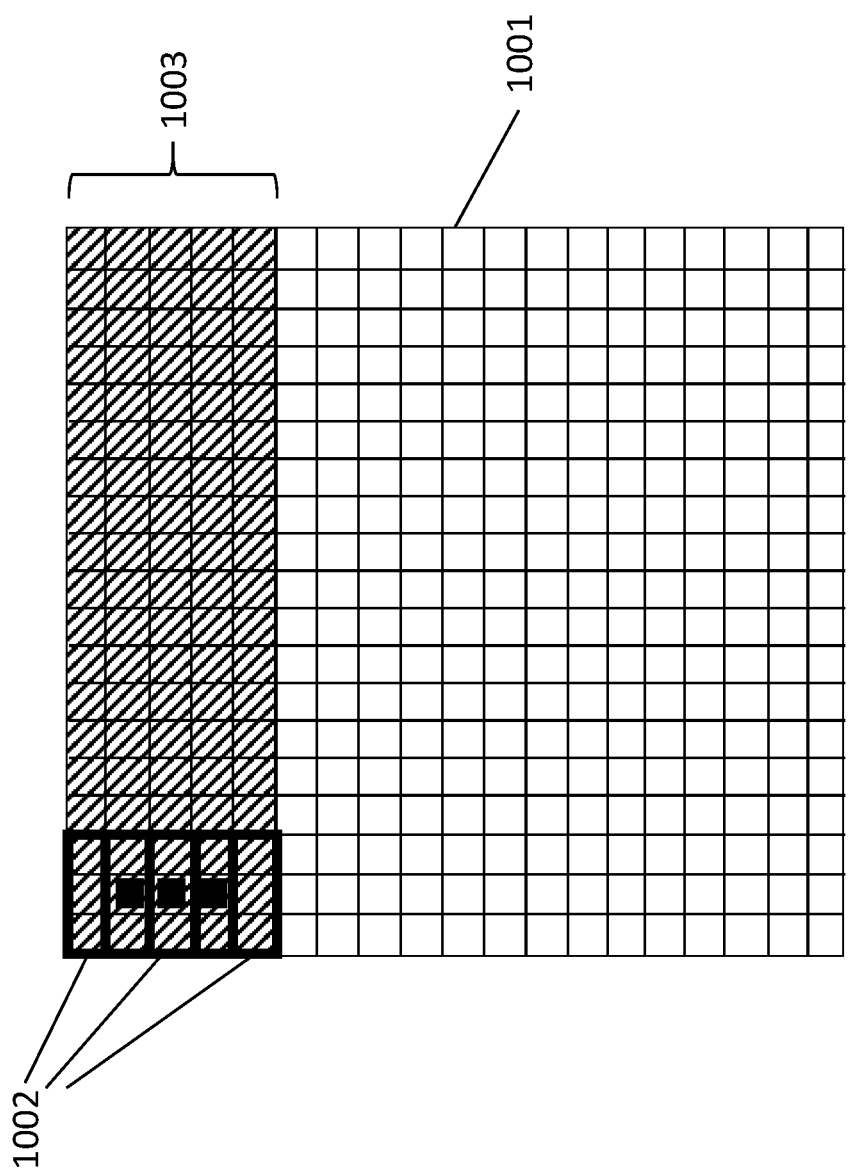
Figure 10C:
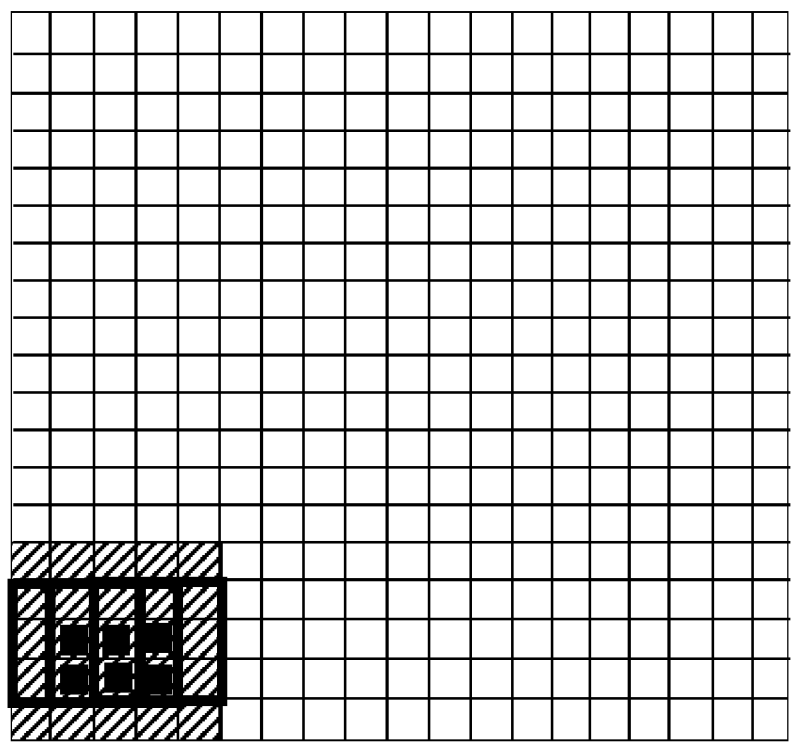
Figure 10D:
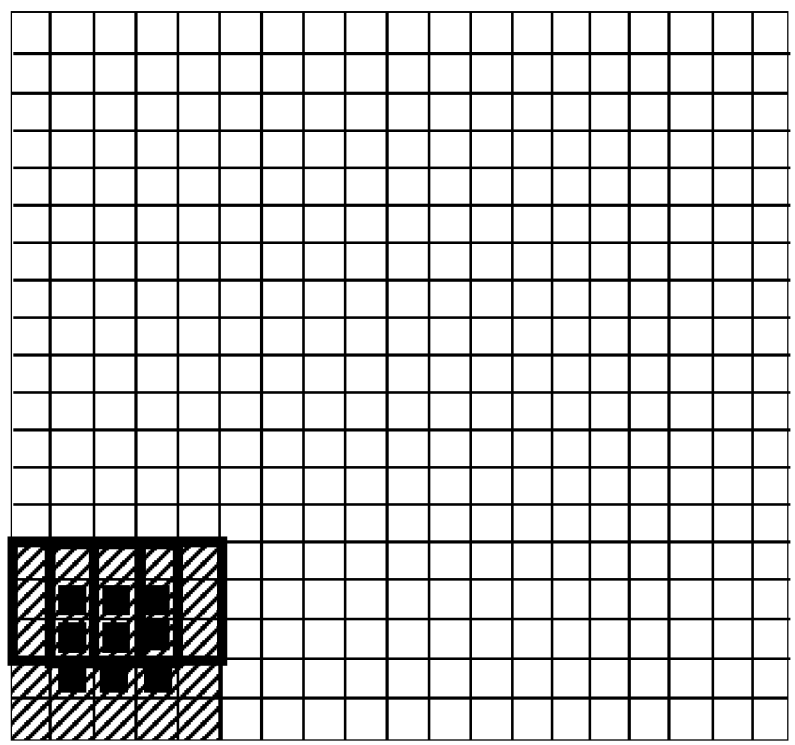

FIG. 10a depicts an embodiment of an input frame of image data 1001. FIG. 10a also depicts an outline of three overlapping stencils 1002 (each having a dimension of 3 pixels×3 pixels) that a stencil processor is designed to operate over. The output pixel that each stencil respectively generates output image data for is highlighted in solid black. For simplicity, the three overlapping stencils 1002 are depicted as overlapping only in the vertical direction. It is pertinent to recognize that in actuality a stencil processor may be designed to have overlapping stencils in both the vertical and horizontal directions.

Because of the vertical overlapping stencils 1002 within the stencil processor, as observed in FIG. 10a, there exists a wide band of image data within the frame that a single stencil processor can operate over. As will be discussed in more detail below, in an embodiment, the stencil processors process data within their overlapping stencils in a left to right fashion across the image data (and then repeat for the next set of lines, in top to bottom order). Thus, as the stencil processors continue forward with their operation, the number of solid black output pixel blocks will grow right-wise horizontally. As discussed above, a line buffer unit 901 is responsible for parsing a line group of input image data from an incoming frame that is sufficient for the stencil processors to operate over for an extended number of upcoming cycles. An exemplary depiction of a line group is illustrated as a shaded region 1003. In an embodiment, the line buffer unit 901 can comprehend different dynamics for sending/receiving a line group to/from a sheet generator. For example, according to one mode, referred to as "full group", the complete full width lines of image data are passed between a line buffer unit and a sheet generator. According to a second mode, referred to as "virtually tall", a line group is passed initially with a subset of full width rows. The remaining rows are then passed sequentially in smaller (less than full width) pieces.

With the line group 1003 of the input image data having been defined by the line buffer unit and passed to the sheet generator unit, the sheet generator unit further parses the line group into finer sheets that are more precisely fitted to the hardware limitations of the stencil processor. More specifically, as will be described in more detail further below, in an embodiment, each stencil processor consists of a two dimensional shift register array. The two dimensional shift register array essentially shifts image data "beneath" an array of execution lanes where the pattern of the shifting causes each execution lane to operate on data within its own respective stencil (that is, each execution lane processes on its own stencil of information to generate an output for that stencil). In an embodiment, sheets are surface areas of input image data that "fill" or are otherwise loaded into the two dimensional shift register array.

As will be described in more detail below, in various embodiments, there are actually multiple layers of two dimensional register data that can be shifted on any cycle. For convenience, much of the present description will simply use the term "two-dimensional shift register" and the like to refer to structures that have one or more such layers of two-dimensional register data that can be shifted.

Thus, as observed in FIG. 10b, the sheet generator parses an initial sheet 1004 from the line group 1003 and provides it to the stencil processor (here, the sheet of data corresponds to the shaded region that is generally identified by reference number 1004). As observed in FIGS. 10c and 10d, the stencil processor operates on the sheet of input image data by effectively moving the overlapping stencils 1002 in a left to right fashion over the sheet. As of FIG. 10d, the number of pixels for which an output value could be calculated from the data within the sheet is exhausted (no other pixel positions can have an output value determined from the information within the sheet). For simplicity the border regions of the image have been ignored.

As observed in FIG. 10e the sheet generator then provides a next sheet 1005 for the stencil processor to continue operations on. Note that the initial positions of the stencils as they begin operation on the next sheet is the next progression to the right from the point of exhaustion on the first sheet (as depicted previously in FIG. 10d). With the new sheet 1005, the stencils will simply continue moving to the right as the stencil processor operates on the new sheet in the same manner as with the processing of the first sheet.

Note that there is some overlap between the data of the first sheet 1004 and the data of the second sheet 1005 owing to the border regions of stencils that surround an output pixel location. The overlap could be handled simply by the sheet generator re-transmitting the overlapping data twice. In alternate implementations, to feed a next sheet to the stencil processor, the sheet generator may proceed to only send new data to the stencil processor and the stencil processor reuses the overlapping data from the previous sheet.

FIG. 11a shows an embodiment of a stencil processor architecture 1100. As observed in FIG. 11a, the stencil processor includes a data computation unit 1101, a scalar processor 1102 and associated memory 1103 and an I/O unit 1104. The data computation unit 1101 includes an array of execution lanes 1105, a two-dimensional shift array structure 1106 and separate random access memories 1107 associated with specific rows or columns of the array.

The I/O unit 1104 is responsible for loading "input" sheets of data received from the sheet generator into the data computation unit 1101 and storing "output" sheets of data from the stencil processor into the sheet generator. In an embodiment the loading of sheet data into the data computation unit 1101 entails parsing a received sheet into rows/columns of image data and loading the rows/columns of image data into the two dimensional shift register structure 1106 or respective random access memories 1107 of the rows/columns of the execution lane array (described in more detail below). If the sheet is initially loaded into memories 1107, the individual execution lanes within the execution lane array 1105 may then load sheet data into the two-dimensional shift register structure 1106 from the random access memories 1107 when appropriate (e.g., as a load instruction just prior to operation on the sheet's data). Upon completion of the loading of a sheet of data into the register structure 1106 (whether directly from a sheet generator or from memories 1107), the execution lanes of the execution lane array 1105 operate on the data and eventually "write back" finished data as a sheet directly back to the sheet generator, or, into the random access memories 1107. If the later the I/O unit 1104 fetches the data from the random access memories 1107 to form an output sheet which is then forwarded to the sheet generator.

The scalar processor 1102 includes a program controller 1109 that reads the instructions of the stencil processor's program code from scalar memory 1103 and issues the instructions to the execution lanes in the execution lane array 1105. In an embodiment, a single same instruction is broadcast to all execution lanes within the array 1105 to effect a SIMD-like behavior from the data computation unit 1101. In an embodiment, the instruction format of the instructions read from scalar memory 1103 and issued to the execution lanes of the execution lane array 1105 includes a very-long-instruction-word (VLIW) type format that includes more than one opcode per instruction. In a further embodiment, the VLIW format includes both an ALU opcode that directs a mathematical function performed by each execution lane's ALU (which, as described below, in an embodiment may specify more than one traditional ALU operation) and a memory opcode (that directs a memory operation for a specific execution lane or set of execution lanes).

The term "execution lane" refers to a set of one or more execution units capable of executing an instruction (e.g., logic circuitry that can execute an instruction). An execution lane can, in various embodiments, include more processor-like functionality beyond just execution units, however. For example, besides one or more execution units, an execution lane may also include logic circuitry that decodes a received instruction, or, in the case of more MIMD-like designs, logic circuitry that fetches and decodes an instruction. With respect to MIMD-like approaches, although a centralized program control approach has largely been described herein, a more distributed approach may be implemented in various alternative embodiments (e.g., including program code and a program controller within each execution lane of the array 1105).

The combination of an execution lane array 1105, program controller 1109 and two dimensional shift register structure 1106 provides a widely adaptable/configurable hardware platform for a broad range of programmable functions. For example, application software developers are able to program kernels having a wide range of different functional capability as well as dimension (e.g., stencil size) given that the individual execution lanes are able to perform a wide variety of functions and are able to readily access input image data proximate to any output array location.

Apart from acting as a data store for image data being operated on by the execution lane array 1105, the random access memories 1107 may also keep one or more look-up tables. In various embodiments one or more scalar look-up tables may also be instantiated within the scalar memory 1103.

A scalar look-up involves passing the same data value from the same look-up table from the same index to each of the execution lanes within the execution lane array 1105. In various embodiments, the VLIW instruction format described above is expanded to also include a scalar opcode that directs a look-up operation performed by the scalar processor into a scalar look-up table. The index that is specified for use with the opcode may be an immediate operand or fetched from some other data storage location. Regardless, in an embodiment, a look-up from a scalar look-up table within scalar memory essentially involves broadcasting the same data value to all execution lanes within the execution lane array 1105 during the same clock cycle. Additional details concerning use and operation of look-up tables is provided further below.

FIG. 11b summarizes the VLIW instruction word embodiments(s) discussed above. As observed in FIG. 11b, the VLIW instruction word format includes fields for three separate instructions: 1) a scalar instruction 1151 that is executed by the scalar processor; 2) an ALU instruction 1152 that is broadcasted and executed in SIMD fashion by the respective ALUs within the execution lane array; and, 3) a memory instruction 1153 that is broadcasted and executed in a partial SIMD fashion (e.g., if execution lanes along a same row in the execution lane array share a same random access memory, then one execution lane from each of the different rows actually execute the instruction (the format of the memory instruction 1153 may include an operand that identifies which execution lane from each row executes the instruction).

A field 1154 for one or more immediate operands is also included. Which of the instructions 1151, 1152, 1153 use which immediate operand information may be identified in the instruction format. Each of instructions 1151, 1152, 1153 also include their own respective input operand and resultant information (e.g., local registers for ALU operations and a local register and a memory address for memory access instructions). In an embodiment, the scalar instruction 1151 is executed by the scalar processor before the execution lanes within the execution lane array execute either of the other two instructions 1152, 1153. That is, the execution of the VLIW word includes a first cycle upon which the scalar instruction 1151 is executed followed by a second cycle upon with the other instructions 1152, 1153 may be executed (note that in various embodiments instructions 1152 and 1153 may be executed in parallel).

In an embodiment, the scalar instructions executed by the scalar processor include commands issued to the sheet generator to load/store sheets from/into the memories or 2D shift register of the data computation unit. Here, the sheet generator's operation can be dependent on the operation of the line buffer unit or other variables that prevent pre-runtime comprehension of the number of cycles it will take the sheet generator to complete any command issued by the scalar processor. As such, in an embodiment, any VLIW word whose scalar instruction 1151 corresponds to or otherwise causes a command to be issued to the sheet generator also includes no-operation (NOOP) instructions in the other two instruction field 1152, 1153. The program code then enters a loop of NOOP instructions for instruction fields 1152, 1153 until the sheet generator completes its load/store to/from the data computation unit. Here, upon issuing a command to the sheet generator, the scalar processor may set a bit of an interlock register that the sheet generator resets upon completion of the command. During the NOOP loop the scalar processor monitors the bit of the interlock bit. When the scalar processor detects that the sheet generator has completed its command normal execution begins again.

FIG. 12 shows an embodiment of a data computation component 1201. As observed in FIG. 12, the data computation component 1201 includes an array of execution lanes 1205 that are logically positioned "above" a two-dimensional shift register array structure 1206. As discussed above, in various embodiments, a sheet of image data provided by a sheet generator is loaded into the two-dimensional shift register 1206. The execution lanes then operate on the sheet data from the register structure 1206.

The execution lane array 1205 and shift register structure 1206 are fixed in position relative to one another. However, the data within the shift register array 1206 shifts in a strategic and coordinated fashion to cause each execution lane in the execution lane array to process a different stencil within the data. As such, each execution lane determines the output image value for a different pixel in the output sheet being generated. From the architecture of FIG. 12 it should be clear that overlapping stencils are not only arranged vertically but also horizontally as the execution lane array 1205 includes vertically adjacent execution lanes as well as horizontally adjacent execution lanes.

Some notable architectural features of the data computation unit 1201 include the shift register structure 1206 having wider dimensions than the execution lane array 1205. That is, there is a "halo" of registers 1209 outside the execution lane array 1205. Although the halo 1209 is shown to exist on two sides of the execution lane array, depending on implementation, the halo may exist on less (one) or more (three or four) sides of the execution lane array 1205. The halo 1205 serves to provide "spill-over" space for data that spills outside the bounds of the execution lane array 1205 as the data is shifting "beneath" the execution lanes 1205. As a simple case, a 5×5 stencil centered on the right edge of the execution lane array 1205 will need four halo register locations further to the right when the stencil's leftmost pixels are processed. For ease of drawing, FIG. 12 shows the registers of the right side of the halo as only having horizontal shift connections and registers of the bottom side of the halo as only having vertical shift connections when, in a nominal embodiment, registers on either side (right, bottom) would have both horizontal and vertical connections. In various embodiments, the halo region does not include corresponding execution lane logic to execute image processing instructions (e.g., no ALU is present). However, individual memory access units (M) are present in each of the halo region locations so that the individual halo register locations can individually load data from memory and store data to memory.

Additional spill-over room is provided by random access memories 1207 that are coupled to each row and/or each column in the array, or portions thereof (E.g., a random access memory may be assigned to a "region" of the execution lane array that spans 4 execution lanes row wise and 2 execution lanes column wise. For simplicity the remainder of the application will refer mainly to row and/or column based allocation schemes). Here, if an execution lane's kernel operations require it to process pixel values outside of the two-dimensional shift register array 1206 (which some image processing routines may require) the plane of image data is able to further spill-over, e.g., from the halo region 1209 into random access memory 1207. For example, consider a 6×6 stencil where the hardware includes a halo region of only four storage elements to the right of an execution lane on the right edge of the execution lane array. In this case, the data would need to be shifted further to the right off the right edge of the halo 1209 to fully process the stencil. Data that is shifted outside the halo region 1209 would then spill-over to random access memory 1207. Other applications of the random access memories 1207 and the stencil processor of FIG. 11a are provided further below.

FIGS. 13a through 13k demonstrate a working example of the manner in which image data is shifted within the two dimensional shift register array "beneath" the execution lane array as alluded to above. As observed in FIG. 13a, the data contents of the two dimensional shift array are depicted in a first array 1307 and the execution lane array is depicted by a frame 1305. Also, two neighboring execution lanes 1310 within the execution lane array are simplistically depicted. In this simplistic depiction 1310, each execution lane includes a register R1 that can accept data from the shift register, accept data from an ALU output (e.g., to behave as an accumulator across cycles), or write output data into an output destination.

Each execution lane also has available, in a local register R2, the contents "beneath" it in the two dimensional shift array. Thus, R1 is a physical register of the execution lane array while R2 is a physical register of the two dimensional shift register array. The execution lane includes an ALU that can operate on operands provided by R1 and/or R2. As will be described in more detail further below, in an embodiment the shift register is actually implemented with multiple (a "depth" of) storage/register elements per array location but the shifting activity is limited to one plane of storage elements (e.g., only one plane of storage elements can shift per cycle). FIGS. 13a through 13k depict one of these deeper register locations as being used to store the resultant X from the respective execution lanes. For illustrative ease the deeper resultant register is drawn alongside rather than beneath its counterpart register R2.

FIGS. 13a through 13k focus on the calculation of two stencils whose central position is aligned with the pair of execution lane positions 1311 depicted within the execution lane array. For ease of illustration, the pair of execution lanes 1310 are drawn as horizontal neighbors when in fact, according to the following example, they are vertical neighbors.

Figure 13A:
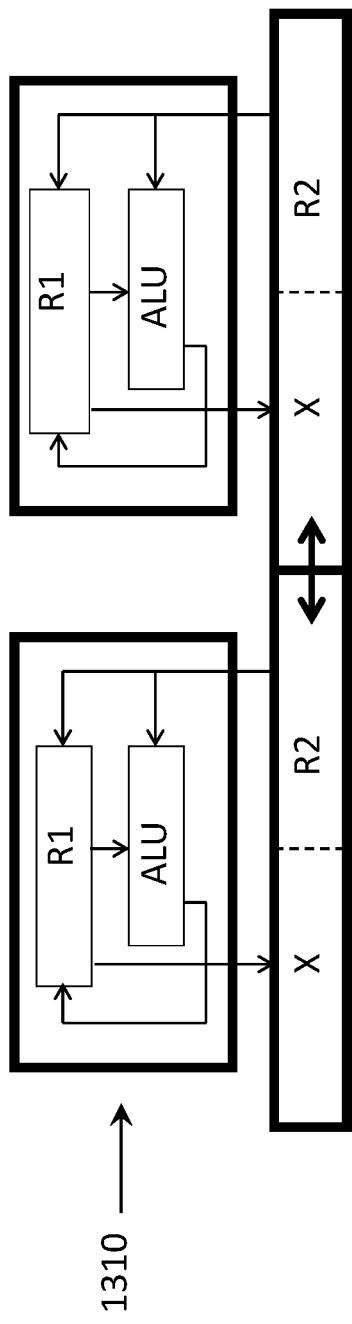
Figure 13A:
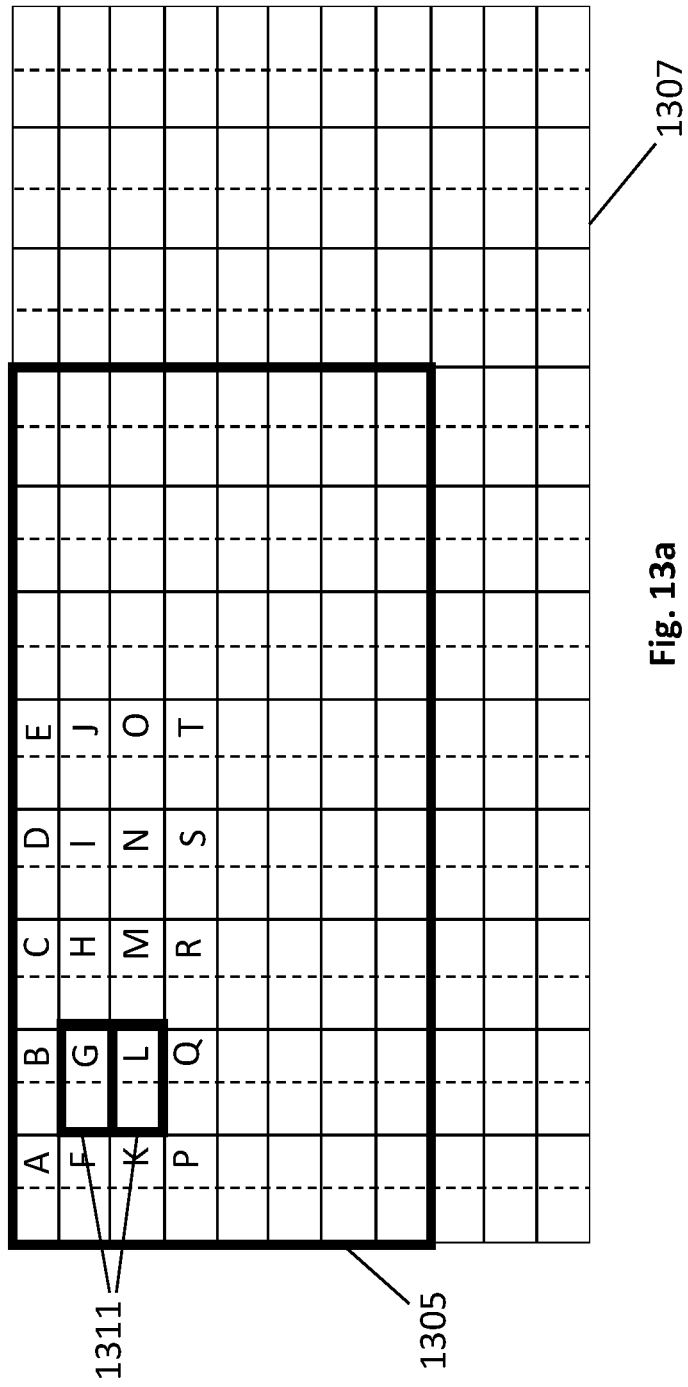
Figure 13B:
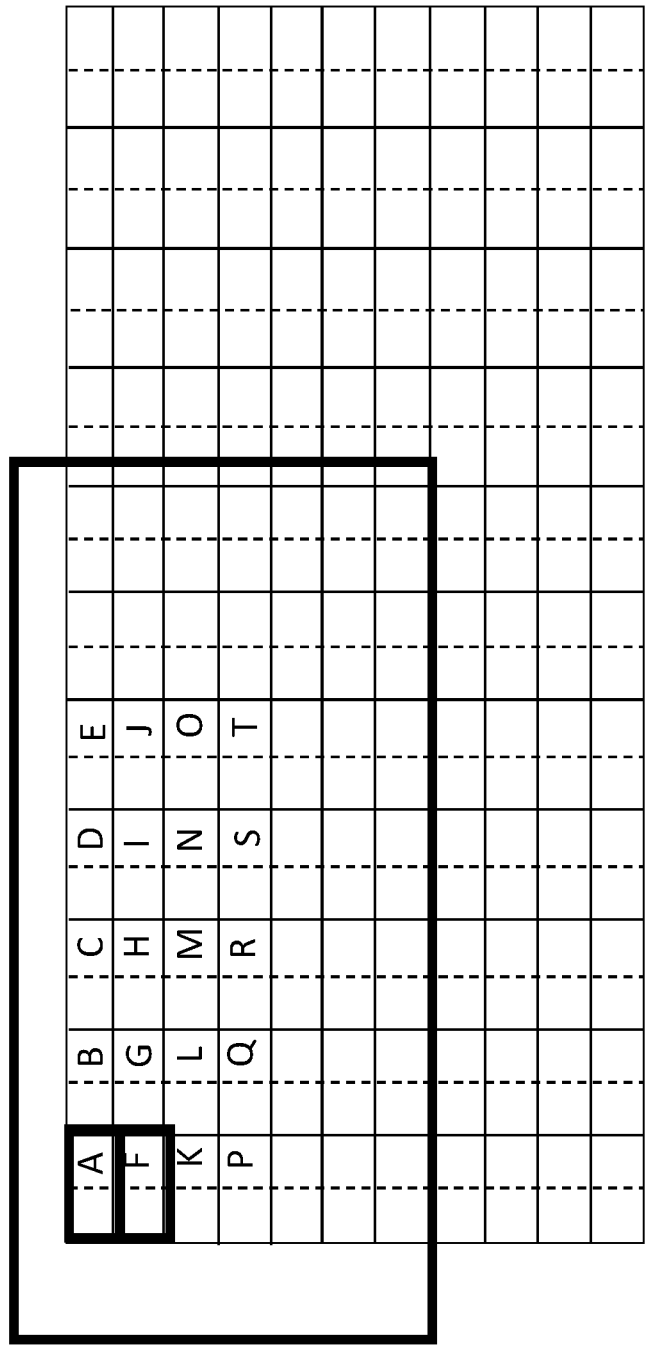

As observed initially in FIG. 13a, the execution lanes are centered on their central stencil locations. FIG. 13b shows the object code executed by both execution lanes. As observed in FIG. 13b the program code of both execution lanes causes the data within the shift register array to shift down one position and shift right one position. This aligns both execution lanes to the upper left hand corner of their respective stencils. The program code then causes the data that is located (in R2) in their respective locations to be loaded into R1.

Figure 13C:
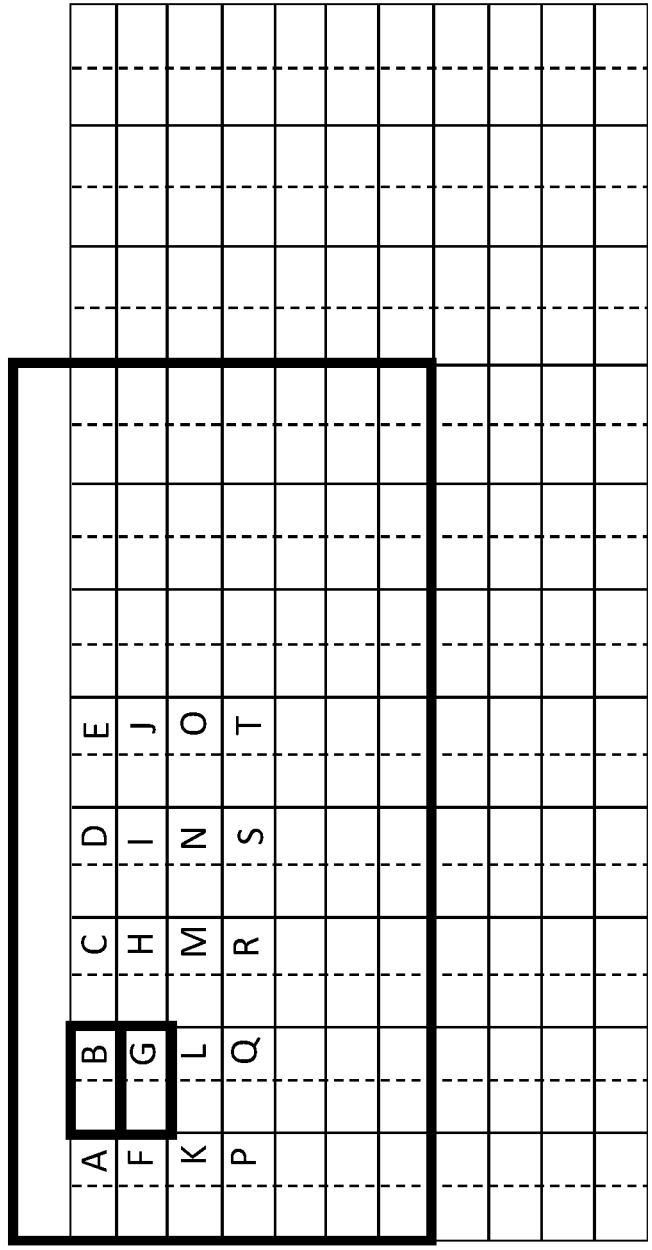
Figure 13D:
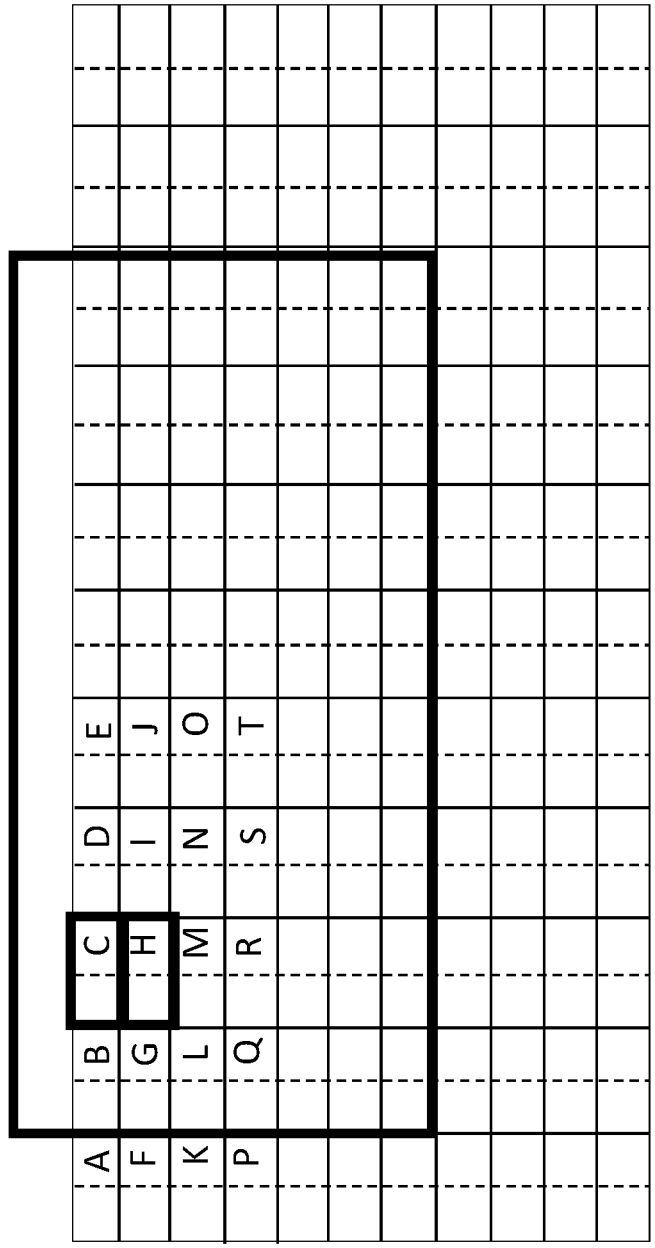

As observed in FIG. 13c the program code next causes the pair of execution lanes to shift the data within the shift register array one unit to the left which causes the value to the right of each execution lane's respective position to be shifted into each execution lane' position. The value in R1 (previous value) is then added with the new value that has shifted into the execution lane's position (in R2). The resultant is written into R1. As observed in FIG. 13d the same process as described above for FIG. 13c is repeated which causes the resultant R1 to now include the value A+B+C in the upper execution lane and F+G+H in the lower execution lane. At this point both execution lanes have processed the upper row of their respective stencils. Note the spill-over into a halo region on the left side of the execution lane array (if one exists on the left hand side) or into random access memory if a halo region does not exist on the left hand side of the execution lane array.

Figure 13E:
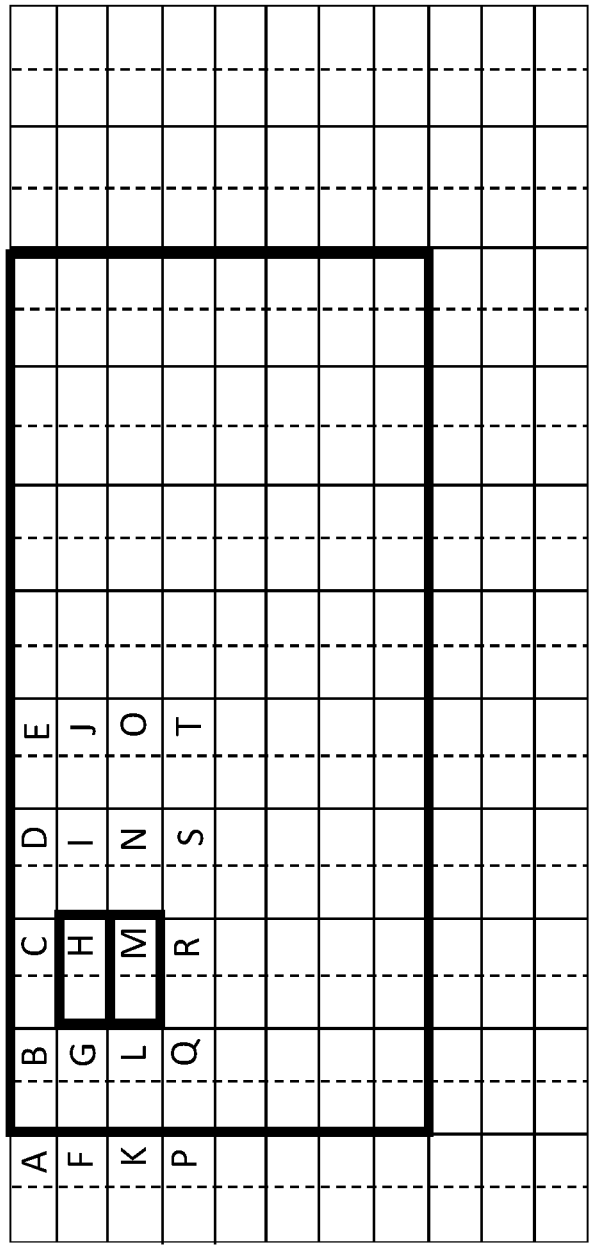
Figure 13F:
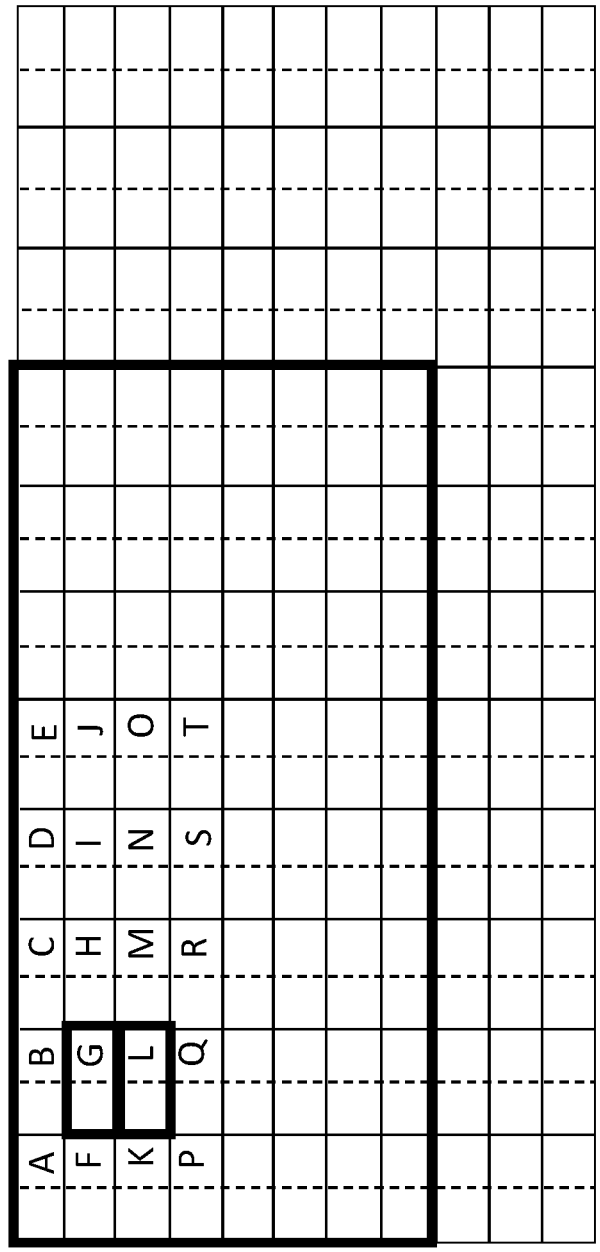
Figure 13G:
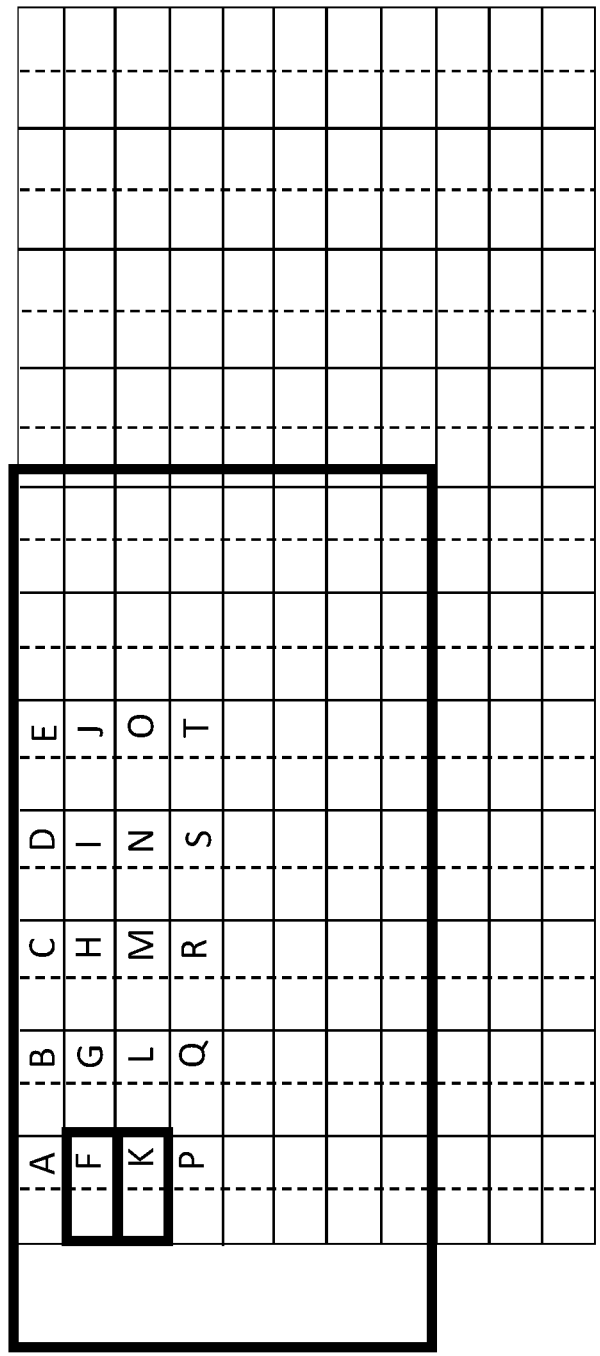

As observed in FIG. 13e, the program code next causes the data within the shift register array to shift one unit up which causes both execution lanes to be aligned with the right edge of the middle row of their respective stencils. Register R1 of both execution lanes currently includes the summation of the stencil's top row and the middle row's rightmost value. FIGS. 13f and 13g demonstrate continued progress moving leftwise across the middle row of both execution lane's stencils. The accumulative addition continues such that at the end of processing of FIG. 13g both execution lanes include the summation of the values of the top row and the middle row of their respective stencils.

Figure 13H:
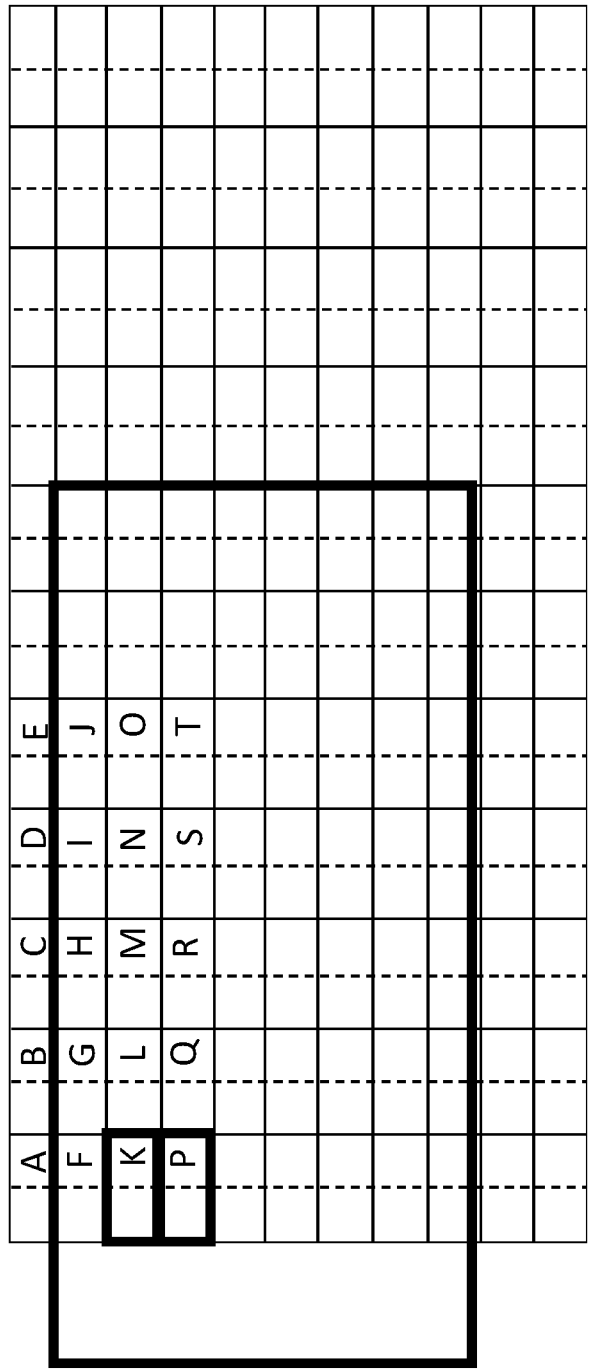
Figure 13I:
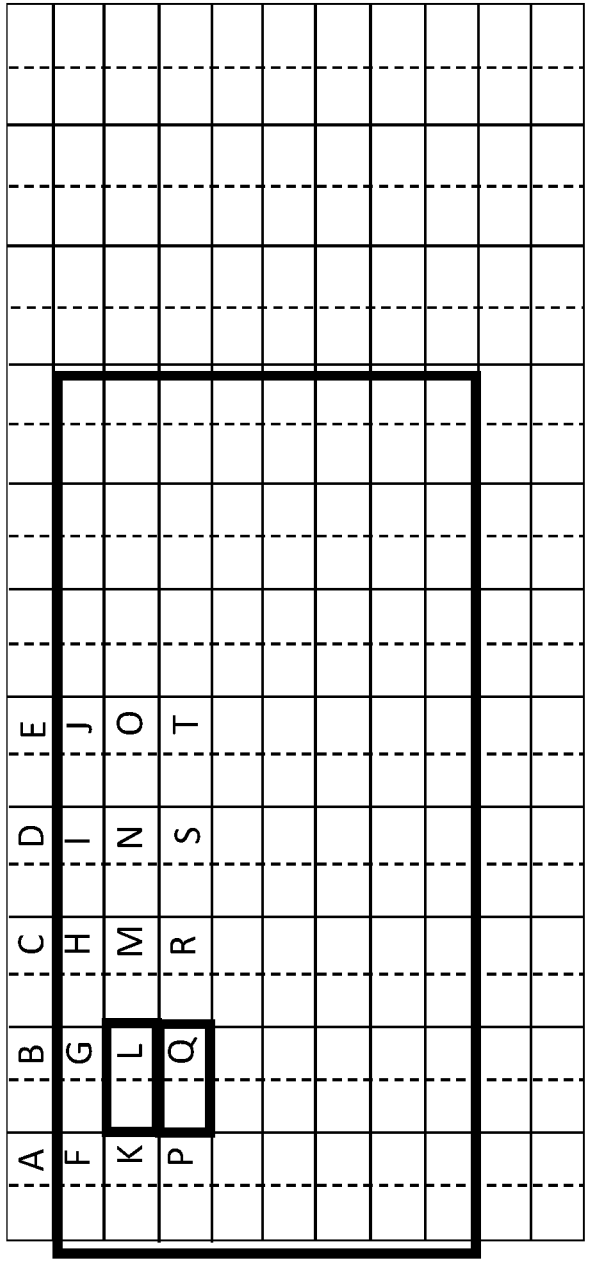
Figure 13J:
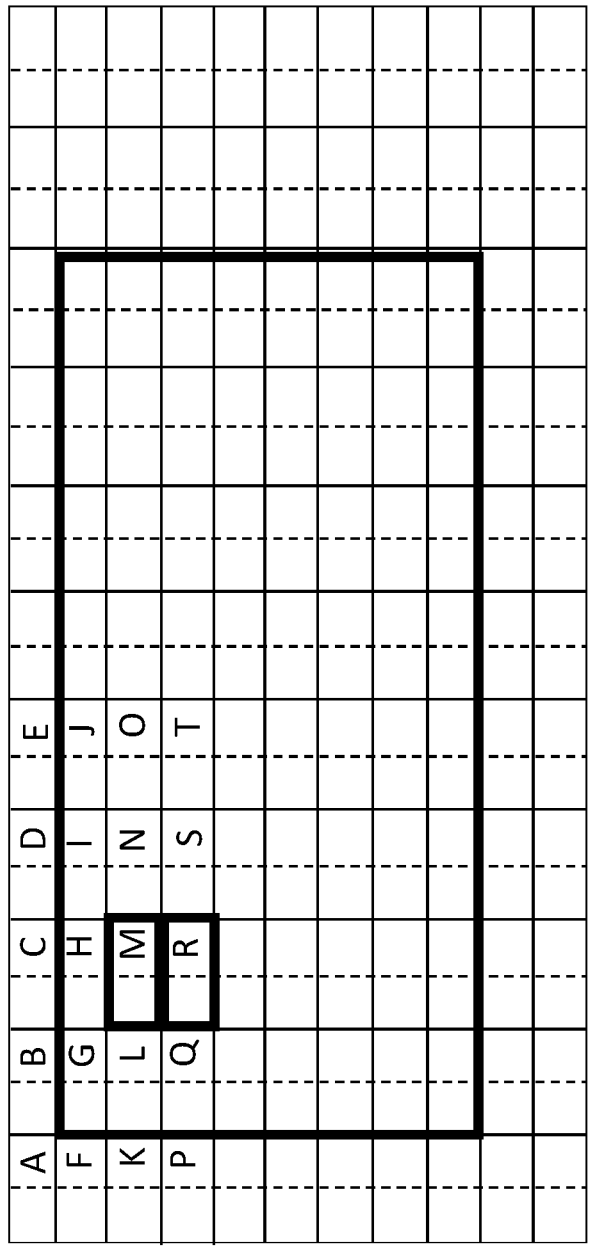
Figure 13K:
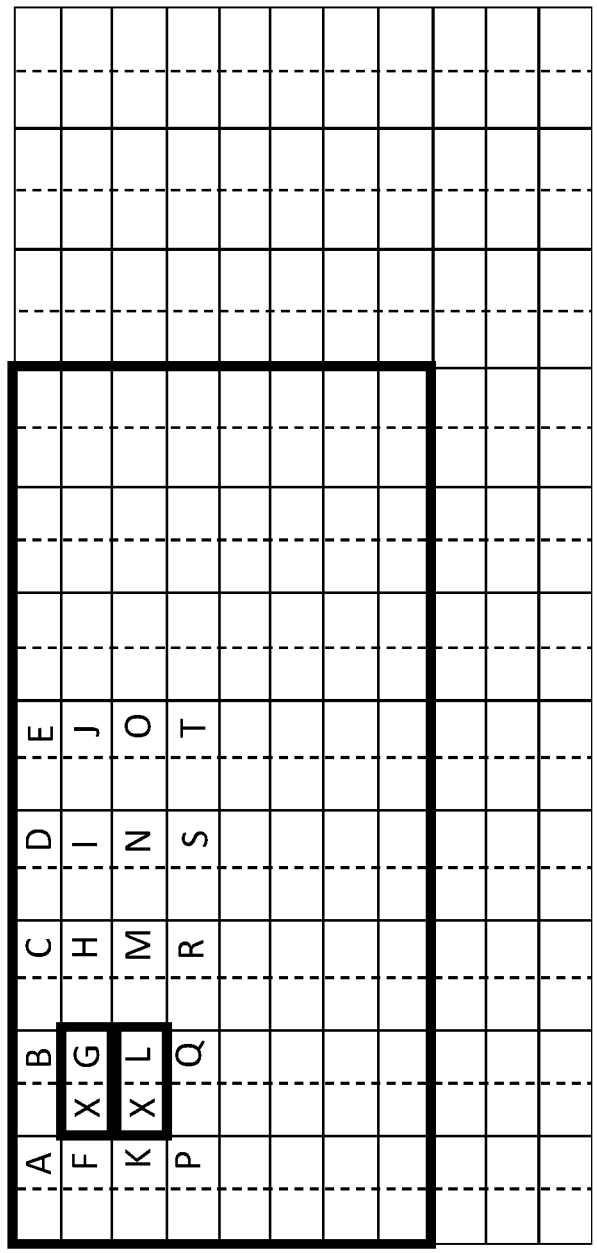

FIG. 13h shows another shift to align each execution lane with its corresponding stencil's lowest row. FIGS. 13i and 13j show continued shifting to complete processing over the course of both execution lanes' stencils. FIG. 13k shows additional shifting to align each execution lane with its correct position in the data array and write the resultant thereto.

In the example of FIGS. 13a-13k note that the object code for the shift operations may include an instruction format that identifies the direction and magnitude of the shift expressed in (X, Y) coordinates. For example, the object code for a shift up by one location may be expressed in object code as SHIFT 0, +1. As another example, a shift to the right by one location may expressed in object code as SHIFT +1, 0. In various embodiments shifts of larger magnitude may also be specified in object code (e.g., SHIFT 0, +2). Here, if the 2D shift register hardware only supports shifts by one location per cycle, the instruction may be interpreted by the machine to require multiple cycle execution, or, the 2D shift register hardware may be designed to support shifts by more than one location per cycle. Embodiments of the later are described in more detail further below.

FIG. 14 shows another, more detailed depiction of the unit cell for an execution lane and corresponding shift register structure (registers in the halo region do not include a corresponding execution lane but do include a memory unit in various embodiments). The execution lane and the register space associated with each location in the execution lane array is, in an embodiment, implemented by instantiating the circuitry observed in FIG. 14 at each node of the execution lane array. As observed in FIG. 14, the unit cell includes an execution lane 1401 coupled to a register file 1402 consisting of four registers R2 through R5. During any cycle, the execution lane 1401 may read from or write to any of registers R1 through R5. For instructions requiring two input operands the execution lane may retrieve both of operands from any of R1 through R5.

In an embodiment, the two dimensional shift register structure is implemented by permitting, during a single cycle, the contents of any of (only) one of registers R2 through R4 to be shifted "out" to one of its neighbor's register files through output multiplexer 1403, and, having the contents of any of (only) one of registers R2 through R4 replaced with content that is shifted "in" from a corresponding one if its neighbors through input multiplexers 1404 such that shifts between neighbors are in a same direction (e.g., all execution lanes shift left, all execution lanes shift right, etc.). Although it may be common for a same register to have its contents shifted out and replaced with content that is shifted in on a same cycle, the multiplexer arrangement 1403, 1404 permits for different shift source and shift target registers within a same register file during a same cycle.

As depicted in FIG. 14 note that during a shift sequence an execution lane will shift content out from its register file 1402 to each of its left, right, top and bottom neighbors. In conjunction with the same shift sequence, the execution lane will also shift content into its register file from a particular one of its left, right, top and bottom neighbors. Again, the shift out target and shift in source should be consistent with a same shift direction for all execution lanes (e.g., if the shift out is to the right neighbor, the shift in should be from the left neighbor).

Although in one embodiment the content of only one register is permitted to be shifted per execution lane per cycle, other embodiments may permit the content of more than one register to be shifted in/out. For example, the content of two registers may be shifted out/in during a same cycle if a second instance of the multiplexer circuitry 1403, 1404 observed in FIG. 14 is incorporated into the design of FIG. 14. Of course, in embodiments where the content of only one register is permitted to be shifted per cycle, shifts from multiple registers may take place between mathematical operations by consuming more clock cycles for shifts between mathematical operations (e.g., the contents of two registers may be shifted between math ops by consuming two shift ops between the math ops).

If less than all the content of an execution lane's register files are shifted out during a shift sequence note that the content of the non shifted out registers of each execution lane remain in place (do not shift). As such, any non shifted content that is not replaced with shifted in content persists local to the execution lane across the shifting cycle. The memory unit ("M") observed in each execution lane is used to load/store data from/to the random access memory space that is associated with the execution lane's row and/or column within the execution lane array. Here, the M unit acts as a standard M unit in that it is often used to load/store data that cannot be loaded/stored from/to the execution lane's own register space. In various embodiments, the primary operation of the M unit is to write data from a local register into memory, and, read data from memory and write it into a local register.

With respect to the ISA opcodes supported by the ALU unit of the hardware execution lane 1401, in various embodiments, the mathematical opcodes supported by the hardware ALU include (e.g., ADD, SUB, MOV, MUL, MAD, ABS, ABS*, DIV, SHL, SHR, MIN/MAX, SEL, AND, OR, XOR, NOT, CLAZ, FINDMIN and SAD. As described just above, memory access instructions can be executed by the execution lane 1401 to fetch/store data from/to their associated random access memory. Additionally the hardware execution lane 1401 supports shift op instructions (right, left, up, down) to shift data within the two dimensional shift register structure. As described above, program control instructions are largely executed by the scalar processor of the stencil processor.

F. Implementation Embodiments

It is pertinent to point out that the various image processor architecture features described above are not necessarily limited to image processing in the traditional sense and therefore may be applied to other applications that may (or may not) cause the image processor to be re-characterized. For example, if any of the various image processor architecture features described above were to be used in the creation and/or generation and/or rendering of animation as opposed to the processing of actual camera images, the image processor may be characterized as a graphics processing unit. Additionally, the image processor architectural features described above may be applied to other technical applications such as video processing, vision processing, image recognition and/or machine learning. Applied in this manner, the image processor may be integrated with (e.g., as a co-processor to) a more general purpose processor (e.g., that is or is part of a CPU of computing system), or, may be a stand alone processor within a computing system.

The hardware design embodiments discussed above may be embodied within a semiconductor chip and/or as a description of a circuit design for eventual targeting toward a semiconductor manufacturing process. In the case of the later, such circuit descriptions may take of the form of a (e.g., VHDL or Verilog) register transfer level (RTL) circuit description, a gate level circuit description, a transistor level circuit description or mask description or various combinations thereof. Circuit descriptions are typically embodied on a computer readable storage medium (such as a CD-ROM or other type of storage technology).

From the preceding sections is pertinent to recognize that an image processor as described above may be embodied in hardware on a computer system (e.g., as part of a handheld device's System on Chip (SOC) that processes data from the handheld device's camera). In cases where the image processor is embodied as a hardware circuit, note that the image data that is processed by the image processor may be received directly from a camera. Here, the image processor may be part of a discrete camera, or, part of a computing system having an integrated camera. In the case of the later the image data may be received directly from the camera or from the computing system's system memory (e.g., the camera sends its image data to system memory rather than the image processor). Note also that many of the features described in the preceding sections may be applicable to a graphics processor unit (which renders animation).

FIG. 15 provides an exemplary depiction of a computing system. Many of the components of the computing system described below are applicable to a computing system having an integrated camera and associated image processor (e.g., a handheld device such as a smartphone or tablet computer). Those of ordinary skill will be able to easily delineate between the two. Additionally, the computing system of FIG. 15 also includes many features of a high performance computing system, such as a workstation or supercomputer.

As observed in FIG. 15, the basic computing system may include a central processing unit 1501 (which may include, e.g., a plurality of general purpose processing cores 1515_1 through 1215_N and a main memory controller 1517 disposed on a multi-core processor or applications processor), system memory 1502, a display 1503 (e.g., touchscreen, flat-panel), a local wired point-to-point link (e.g., USB) interface 1504, various network I/O functions 1505 (such as an Ethernet interface and/or cellular modem subsystem), a wireless local area network (e.g., WiFi) interface 1506, a wireless point-to-point link (e.g., Bluetooth) interface 1507 and a Global Positioning System interface 1508, various sensors 1509_1 through 1509_N, one or more cameras 1510, a battery 1511, a power management control unit 1512, a speaker and microphone 1513 and an audio coder/decoder 1514.

An applications processor or multi-core processor 1550 may include one or more general purpose processing cores 1515 within its CPU 1201, one or more graphical processing units 1516, a memory management function 1517 (e.g., a memory controller), an I/O control function 1518 and an image processing unit 1519. The general purpose processing cores 1515 typically execute the operating system and application software of the computing system. The graphics processing units 1516 typically execute graphics intensive functions to, e.g., generate graphics information that is presented on the display 1503. The memory control function 1517 interfaces with the system memory 1502 to write/read data to/from system memory 1502. The power management control unit 1512 generally controls the power consumption of the system 1500.

The image processing unit 1519 may be implemented according to any of the image processing unit embodiments described at length above in the preceding sections. Alternatively or in combination, the IPU 1519 may be coupled to either or both of the GPU 1516 and CPU 1501 as a co-processor thereof. Additionally, in various embodiments, the GPU 1516 may be implemented with any of the image processor features described at length above. Further still, any of the general purpose processing cores, the image processing unit and/or GPU may make use of the arithmetic logic unit designs and/or instructions described above.

Each of the touchscreen display 1503, the communication interfaces 1504-1507, the GPS interface 1508, the sensors 1509, the camera 1510, and the speaker/microphone codec 1513, 1514 all can be viewed as various forms of I/O (input and/or output) relative to the overall computing system including, where appropriate, an integrated peripheral device as well (e.g., the one or more cameras 1510). Depending on implementation, various ones of these I/O components may be integrated on the applications processor/multi-core processor 1550 or may be located off the die or outside the package of the applications processor/multi-core processor 1550.

In an embodiment one or more cameras 1510 includes a depth camera capable of measuring depth between the camera and an object in its field of view. Application software, operating system software, device driver software and/or firmware executing on a general purpose CPU core (or other functional block having an instruction execution pipeline to execute program code) of an applications processor or other processor may perform any of the functions described above.

Embodiments of the invention may include various processes as set forth above. The processes may be embodied in machine-executable instructions. The instructions can be used to cause a general-purpose or special-purpose processor to perform certain processes. Alternatively, these processes may be performed by specific hardware components that contain hardwired and/or programmable logic for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An execution unit comprising a first arithmetic logic unit (ALU) and a second ALU, wherein the execution unit is configured to perform a sum of absolute difference (SAD) computation using ALU operations comprising:
    computing a first difference between a first input value and a second input value at the first ALU;
    based on determining that the first difference is positive, computing a SAD value at a second ALU by adding a sum of a third input value to the first difference; and
    outputting the computed SAD value.

2. The execution unit of claim 1, wherein the execution unit is configured to compute the SAD value from a single instruction.

3. The execution unit of claim 2, wherein the single instruction references the first value, the second value, and the third value.

4. The execution unit of claim 3, wherein the third value is an operand of the single instruction.

5. The execution unit of claim 1, wherein the second ALU is configured to receive two inputs, the two inputs comprising the first difference from the first ALU and the third input value.

6. The execution unit of claim 1, wherein the second ALU is configured to perform an absolute value computation including adding a zero value to the third input value whenever the third input value is positive.

7. The execution unit of claim 1, wherein the second ALU is configured to perform an absolute value computation including subtracting the third input value from a zero value whenever the third input value is negative.

8. An execution unit comprising a first arithmetic logic unit (ALU) and a second ALU, wherein the execution unit is configured to perform a sum of absolute difference (SAD) computation using ALU operations comprising:
    computing a first difference between a first input value and a second input value at the first ALU;
    based on determining that the first difference is negative, computing a SAD value at a second ALU by subtracting the first difference from a third input value; and
    outputting the computed SAD value.

9. The execution unit of claim 8, wherein the execution unit is configured to compute the SAD value from a single instruction.

10. The execution unit of claim 9, wherein the single instruction references the first value, the second value, and the third value.

11. The execution unit of claim 10, wherein the third value is an operand of the single instruction.

12. The execution unit of claim 8, wherein the second ALU is configured to receive two inputs, the two inputs comprising the first difference from the first ALU and the third input value.

13. The execution unit of claim 8, wherein the second ALU is configured to perform an absolute value computation including adding a zero value to the third input value whenever the third input value is positive.

14. The execution unit of claim 8, wherein the second ALU is configured to perform an absolute value computation including subtracting the third input value from a zero value whenever the third input value is negative.

15. A method for performing a sum of absolute difference (SAD) computation performed by an execution unit comprising a first arithmetic logic unit (ALU) and a second ALU, the method comprising:
    computing a first difference between a first input value and a second input value at the first ALU;
    based on determining that the first difference is negative, computing a SAD value at a second ALU by subtracting the first difference from a third input value; and
    outputting the computed SAD value.

16. The method of claim 15, wherein performing the SAD computation requires only a single instruction.

17. The method of claim 16, wherein the single instruction references the first value, the second value, and the third value.

18. The method of claim 17, wherein the third value is an operand of the single instruction.

19. The method of claim 15, wherein the second ALU is configured to receive two inputs, the two inputs comprising the first difference from the first ALU and the third input value.

20. The method of claim 15, further comprising performing, by the second ALU, an absolute value computation including adding a zero value to the third input value whenever the third input value is positive.

* * * * *